(12) United States Patent
Seo et al.

(10) Patent No.: US 8,710,495 B2
(45) Date of Patent: *Apr. 29, 2014

(54) LIGHT-EMITTING ELEMENT, LIGHT-EMITTING DEVICE, AND ELECTRONIC DEVICE

(71) Applicant: Semiconductor Energy laboratory Co., Ltd., Atsugi (JP)

(72) Inventors: Satoshi Seo, Kanagawa (JP); Kaoru Ikeda, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/644,893

(22) Filed: Oct. 4, 2012

(65) Prior Publication Data

US 2013/0026460 A1   Jan. 31, 2013

Related U.S. Application Data

(63) Continuation of application No. 12/546,038, filed on Aug. 24, 2009, now Pat. No. 8,299,456.

(30) Foreign Application Priority Data

Sep. 1, 2008   (JP) .................................. 2008-223210

(51) Int. Cl.
    *H01L 29/08*   (2006.01)
(52) U.S. Cl.
    USPC .................................... 257/40; 257/E51.026
(58) Field of Classification Search
    USPC .............. 257/40, E51.018, E51.026, E33.013
    See application file for complete search history.

(56) References Cited

U.S. PATENT DOCUMENTS

5,283,132 A   2/1994 Ogura et al.
6,303,238 B1  10/2001 Thompson et al.
(Continued)

FOREIGN PATENT DOCUMENTS

CN   1438829 A     8/2003
EP   1 512 768 A1  3/2005
(Continued)

OTHER PUBLICATIONS

Baldo, M.A. et al, "Highly Efficient Phosphorescent Emission from Organic Electroluminescent Devices," Nature, vol. 395, Sep. 10, 1998, pp. 151-154.

(Continued)

*Primary Examiner* — Hung Vu
(74) *Attorney, Agent, or Firm* — Husch Blackwell LLP

(57) ABSTRACT

Disclosed is a light-emitting element having a light-emitting layer which includes a first layer, a second layer, and a third layer provided in this order on an anode side between the anode and a cathode. The first layer has a hole-transporting property, the second layer has a bipolar property, and the third layer has an electron-transporting property, wherein the first layer contains a first fluorescent compound and a hole-transporting organic compound, the second layer contains a phosphorescent compound and a host material, and the third layer contains a second fluorescent compound and an electron-transporting organic compound. The light-emitting layer is also arranged so that the triplet-excitation energy of both the hole-transporting organic compound and the electron-transporting organic compound are greater than that of the host material. The use of the light-emitting layer with the above-mentioned structure enables production of a light-emitting element with improved luminous efficiency and reduced power consumption.

20 Claims, 16 Drawing Sheets

(56) References Cited

U.S. PATENT DOCUMENTS

| | | |
|---|---|---|
| 6,310,360 B1 | 10/2001 | Forrest et al. |
| 6,420,031 B1 | 7/2002 | Parthasarathy et al. |
| 6,515,298 B2 | 2/2003 | Forrest et al. |
| 6,602,618 B2 | 8/2003 | Watanabe et al. |
| 6,614,176 B2 | 9/2003 | Kim et al. |
| 6,714,178 B2 | 3/2004 | Koyama et al. |
| 6,876,144 B2 | 4/2005 | Peng |
| 6,995,509 B2 | 2/2006 | Yamazaki et al. |
| 7,009,338 B2 | 3/2006 | D'Andrade et al. |
| 7,116,044 B2 | 10/2006 | Fukunaga |
| 7,399,991 B2 | 7/2008 | Seo et al. |
| 7,474,049 B2 | 1/2009 | Liu et al. |
| 7,579,773 B2 | 8/2009 | Forrest et al. |
| 7,601,435 B2 | 10/2009 | Shitagaki et al. |
| 7,768,194 B2 | 8/2010 | Forrest et al. |
| 7,795,799 B2 | 9/2010 | Mishima |
| 7,803,469 B2 | 9/2010 | Lee et al. |
| 7,955,709 B2 | 6/2011 | Jeong et al. |
| 8,072,135 B2 | 12/2011 | Kashiwabara et al. |
| 8,110,293 B2 | 2/2012 | Ahn et al. |
| 8,299,456 B2 * | 10/2012 | Seo et al. .................. 257/40 |
| 2004/0232830 A1 | 11/2004 | Hieda |
| 2005/0100760 A1 | 5/2005 | Yokoyama |
| 2005/0238806 A1 | 10/2005 | Yanashima et al. |
| 2006/0158104 A1 | 7/2006 | Iijima et al. |
| 2006/0263638 A1 | 11/2006 | Kawakami et al. |
| 2007/0194703 A1 | 8/2007 | Lin et al. |
| 2007/0202355 A1 | 8/2007 | Kim et al. |
| 2008/0102310 A1 | 5/2008 | Thompson et al. |
| 2008/0284317 A1 | 11/2008 | Liao et al. |
| 2008/0286607 A1 | 11/2008 | Nomura et al. |
| 2008/0312437 A1 * | 12/2008 | Inoue et al. .................. 544/225 |
| 2009/0091240 A1 | 4/2009 | Ikeda et al. |
| 2009/0091255 A1 | 4/2009 | Lee et al. |
| 2010/0052527 A1 | 3/2010 | Ikeda et al. |

FOREIGN PATENT DOCUMENTS

| | | |
|---|---|---|
| EP | 1 662 844 A1 | 5/2006 |
| EP | 1 670 083 A2 | 6/2006 |
| EP | 1 936 715 A1 | 6/2008 |
| JP | 8-78163 | 3/1996 |
| JP | 2002-164171 | 6/2002 |
| JP | 2003-187977 | 7/2003 |
| JP | 2004-006102 | 1/2004 |
| JP | 2004-014311 | 1/2004 |
| JP | 2005-071735 | 3/2005 |
| JP | 2006-172762 | 6/2006 |
| JP | 2007-019070 | 1/2007 |
| JP | 2007-027092 | 2/2007 |
| JP | 2008-159582 | 7/2008 |
| JP | 2009-540563 | 11/2009 |
| JP | 2010-507922 | 3/2010 |
| WO | WO 2007/145719 A1 | 12/2007 |
| WO | WO 2008/054578 A1 | 5/2008 |

OTHER PUBLICATIONS

O'Brien, D.F. et al, "Improved Energy Transfer in Electrophosphorescent Devices," Applied Physics Letters, vol. 74, no. 3, Jan. 18, 1999, pp. 442-444.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Sun, Y. et al, "Management of Singlet and Triplet Excitons for Efficient White Organic Light-Emitting Devices," Nature, vol. 440, Apr. 13, 2006, pp. 908-912.

Kondakova, M.E. et al, "17.3: Highly Efficient Fluorescent/Phosphorescent Oled Devices Using Triplet Harvesting," SID Digest '08: SID International Symposium Digest of Technical Papers, vol. 39, 2008, pp. 219-222.

Office Action re Chinese application No. CN 200910168681.1, dated Apr. 23, 2013 (with English translation).

Lee, J.-I. et al., "Harvest of Triplet Excitons in Fluorescence Emission Layer Based on a Wide Band Gap Host of TcTa for Efficient White Organic Light Emitting Diodes," Proceedings of SPIE, vol. 6655, Oct. 15, 2007, pp. 1-4, (66550I-1-66550I-4).

Schwartz, G. et al., "Harvesting Triplet Excitons from Fluorescent Blue Emitters for High-Efficiency White Organic Light Emitting Diodes," Proceedings of the SPIE, vol. 6655, Oct. 16, 2007, pp. 1-5, (66550J-1-66550J-5).

* cited by examiner

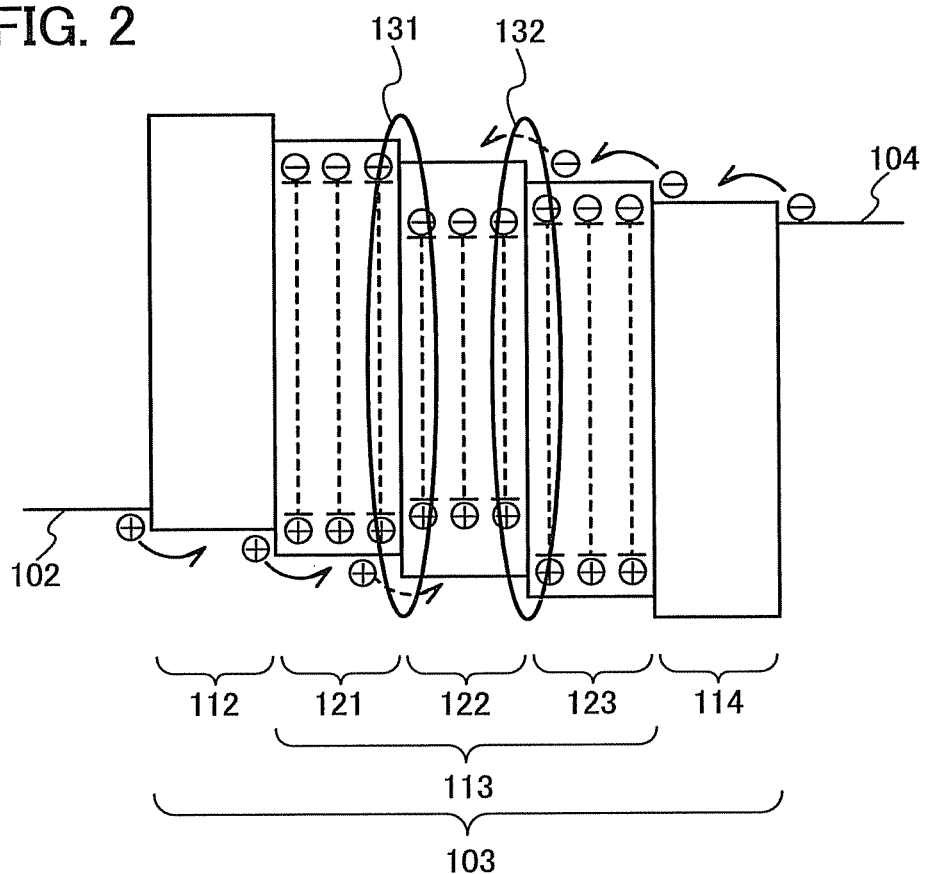

ns is eoo oe# LIGHT-EMITTING ELEMENT, LIGHT-EMITTING DEVICE, AND ELECTRONIC DEVICE This application is a continuation of copending application Ser. No. 12/546,038 filed on Aug. 24, 2009.

BACKGROUND OF THE INVENTION ION

1. Field of the Invention

The present invention relates to light-emitting elements using electroluminescence. In addition, the present invention relates to light-emitting devices and electronic devices including the light-emitting elements.

2. Description of the Related Art

In recent years, extensive research and development on the light-emitting elements using electroluminescence have been carried out. In a basic structure of the light-emitting elements, a light-emitting substance is interposed between a pair of electrodes. When voltage is applied to the elements, the light-emitting substance can emit light.

Since the above light-emitting element is of a self-light-emitting type, it has advantages that the visibility of its pixels is higher than that of a liquid crystal display, that a backlight is not required, and the like. Because of the advantages, the light-emitting element is known to be suitable for a flat panel display element. Another major advantage of the light-emitting element is that it can be manufactured to be thin and lightweight. In addition, the light-emitting element has a feature that its response speed is extremely high.

The light-emitting element can be formed into a film form. When the element is formed to have a large area, plane emission can be easily obtained. This feature is hard to obtain from point sources typified by an incandescent lamp and an LED, or linear sources typified by a fluorescent light. Thus, the light-emitting element is of value as a plane light source that can be applied to lighting and the like.

Light-emitting elements using electroluminescence are broadly classified depending on whether the light-emitting substance is an organic compound or an inorganic compound.

In a case where an organic compound is used as the light-emitting substance, by the application of voltage to the light-emitting element, electrons and holes are injected from a pair of electrodes into a layer containing the light-emitting organic compound, and current flows. When these carriers (electrons and holes) are recombined, the light-emitting organic compound is excited. When the excited state returns to a ground state, light emission is obtained. Owing to the above mechanism, such a light-emitting element is referred to as a current-excitation light-emitting element.

Note that types of excited states of an organic compound include a singlet excited state and a triplet excited state, and light emission from the singlet excited state is referred to as fluorescence, and light emission from the triplet excited state, phosphorescence.

Problems of such a light-emitting element mainly originate from unsatisfactory performance of materials. In order to enhance the element characteristic, structures of the light-emitting element and materials used therein have been developed.

For example, according to Non-Patent Document 1, a method called Triplet Harvesting was used to form a highly efficient light-emitting element.

REFERENCE

Non-Patent Document

[Non-Patent Document 1]

M. E. Kondakova, et al., SID 08 DIGEST, pp. 219-222 (2008)

In a structure described in Non-Patent Document 1, a light-emitting layer (Yellow LEL) containing a yellow emissive phosphorescent compound is provided on a cathode side of a light-emitting layer (Blue LEL) containing a blue emissive fluorescent compound. Therefore, a part of the triplet excitation energy of the blue emissive fluorescent compound is transferred to the cathode side, which allows the yellow emissive phosphorescent compound in the Yellow LEL to emit light. On the other hand, since an electron-blocking layer (EBL) having greater triplet-excitation energy than that in the Blue LEL is provided on the anode side of the Blue LEL, the transfer of the triplet excitation energy of the blue emissive fluorescent compound to an anode side is impossible. Thus, a part of the triplet excitation energy of the blue emissive fluorescent compound is consumed through the nonradiative process and does not contribute to the light emission.

In view of the above problem, an object of one embodiment in the present invention is to enhance the luminous efficiency of a light-emitting element.

Another object is to reduce the power consumption of a light-emitting element, a light-emitting device, and an electronic device.

SUMMARY OF THE INVENTION

The present inventors found out that providing two main recombination regions and a light-emitting layer containing a substance that exhibits phosphorescence (hereinafter, referred to as a phosphorescent compound) between the two recombination regions results in high luminous efficiency.

An embodiment of the present invention is a light-emitting element including a first layer, a second layer, and a third layer provided in this order on an anode side between the anode and a cathode. The first layer has a hole-transporting property; the second layer, a bipolar property; and the third layer, an electron-transporting property. The first layer contains a first fluorescent compound and a hole-transporting organic compound; the second layer, a phosphorescent compound and a host material; and the third layer, a second fluorescent compound and an electron-transporting organic compound. The triplet-excitation energy of the hole-transporting organic compound and the triplet-excitation energy of the electron-transporting organic compound are greater than the triplet-excitation energy of the host material.

In the above structure, the host material is preferably a bipolar organic compound.

In addition, in the above structure, a spacing layer comprising a bipolar organic compound is preferably provided between the first layer and the second layer. With the spacing layer, energy transfer from the first layer to the second layer can be adjusted. Further, another spacing layer comprising a bipolar organic compound is preferably provided between the second layer and the third layer. With the spacing layer, energy transfer from the third layer to the second layer can be adjusted. The thickness of each of the spacing layers is preferably from 1 nm to 30 nm, inclusive. If the thickness is more than 30 nm, the triplet exciton energy cannot be transferred from the recombination regions to the second layer; accordingly, light emission from the second layer becomes weak. Therefore, the thickness of each of the spacing layers is preferably from 1 nm to 30 nm, inclusive.

In the above structure, the thickness of the second layer is preferably from 5 nm to 20 nm, inclusive. If the second layer is too thick, balance of light emission from the first layer and the third layer is disturbed. If the second layer is too thin, the light emission from the second layer becomes weak. Therefore, by setting the thickness of the second layer to the above range, the light emission from the first layer, the second layer, and the third layer can be obtained with an excellent balance.

In addition, in the above structure, the first fluorescent organic compound and the second fluorescent organic compound are preferably the same organic compound; accordingly, the manufacture of the light-emitting element becomes easy.

In the above structure, it is preferable that a first fluorescent compound and a second fluorescent compound be the same organic compound and that the emission color of the first fluorescent compound and the second fluorescent compound and the emission color of the phosphorescent compound be complementary colors. With such a structure, a white emissive light-emitting element can be obtained.

In addition, in the above structure, the second layer may contain plural types of phosphorescent compounds. In this case, the first fluorescent compound and the second fluorescent compound are the same organic compound, the emission color of the first fluorescent organic compound and the second fluorescent organic compound is blue, the emission color of a phosphorescent compound among plural types is green and the emission color of another phosphorescent compound is red; accordingly, the white emissive light-emitting element can be obtained.

An embodiment of the present invention encompasses a light-emitting device including the above-described light-emitting element. The light-emitting device in the present specification encompasses an image display device, a light-emitting device, and a light source including a lighting device. The light-emitting device also encompasses the following: a module in which a connector, for example, a flexible printed circuit (FPC), a tape automated bonding (TAB) tape, or a tape carrier package (TCP) is attached to a panel provided with a light-emitting element; a module provided with a printed wiring board at the end of the TAB tape or the TCP; and a module in which an integrated circuit (IC) is directly mounted on a light-emitting element by a chip on glass (COG) method.

An embodiment of the present invention further encompasses an electronic device in which the light-emitting element of an embodiment of the present invention is used in a display portion. Consequently, one feature of an electronic device of an embodiment of the present invention is to include a display portion, and the display portion is provided with the above-described light-emitting element and a control means for controlling the light emission of the light-emitting element.

The light-emitting element with high luminous efficiency can be realized by the application of an embodiment of the present invention.

In addition, the consumption power of a light-emitting element, a light-emitting device, and an electronic device can be reduced by the application of an embodiment of the present invention.

BRIEF DESCRIPTION OF THE DRAWINGS

In the accompanying drawings:

FIG. 2 is a band diagram of a light-emitting element according to one embodiment of the present invention;

DETAILED DESCRIPTION OF THE INVENTION

Figure 1:
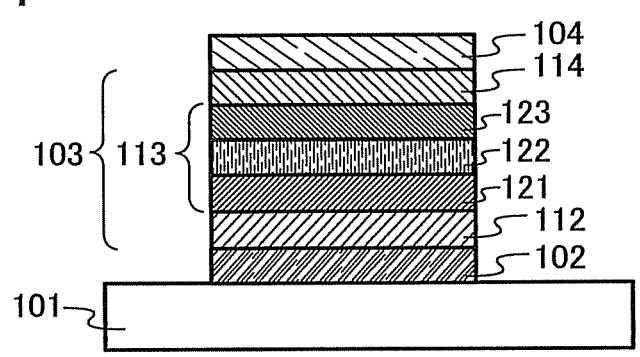
FIG. 1 illustrates a light-emitting element according to one embodiment of the present invention.

Hereinafter, embodiments of the present invention are described in detail with reference to the accompanying drawings. However, embodiments of the present invention are not limited to the following description, and various changes and modifications for the modes and details thereof are apparent to those skilled in the art unless such changes and modifications depart from the spirit and scope of the invention. Therefore, the present invention should not be interpreted as being limited to what is described in the embodiments described below. Note that like portions or portions having a similar function are denoted by the same reference numerals through drawings, and therefore, description thereon can be omitted.
Embodiment 1

One embodiment of a light-emitting element according to the present invention is described below with reference to FIGS. 1, 2, 3A, 3B, and 4.

A light-emitting element of an embodiment of the present invention has a plurality of layers between a pair of electrodes. In this specification, the plurality of layers formed between the pair of electrodes are collectively referred to as an EL layer hereinafter. The EL layer includes at least a light-emitting layer.

In Embodiment 1, as illustrated in FIG. 1, the light-emitting element includes a first electrode 102, a second electrode 104, and an EL layer 103 formed between the first electrode 102 and the second electrode 104. Note that, in this embodiment, the first electrode 102 serves as an anode and the second electrode 104 serves as a cathode. In other words, when voltage is applied to the first electrode 102 and the second electrode 104 such that the potential of the first electrode 102 is higher than that of the second electrode 104, light emission can be obtained. Such a case is described below.

A substrate 101 is used as a support of the light-emitting element. The substrate 101 can be formed with, for example, glass, plastic, or the like. Note that materials other than glass or plastic can also be used as long as they can serve as a support of the light-emitting element.

The first electrode 102 is preferably formed using a metal, an alloy, an electrically conductive compound, a mixture of these materials, or the like, having a high work function; specifically, a work function of 4.0 eV or higher is preferable. Specific examples include indium oxide-tin oxide (ITO: Indium Tin Oxide), indium oxide-tin oxide containing silicon or silicon oxide, indium oxide-zinc oxide (TZO: Indium Zinc Oxide), indium oxide containing tungsten oxide and zinc oxide (IWZO), and the like. These conductive metal oxide films are generally formed by sputtering; however, the films may also be formed by the application of a sol-gel method or the like. For example, indium oxide-zinc oxide (TZ0) can be formed by a sputtering method in which indium oxide added with 1 to 20 wt % of zinc oxide is used as a target. Indium oxide containing tungsten oxide and zinc oxide (IWZO) can be formed by a sputtering method in which indium oxide added with 0.5 to 5 wt % of tungsten oxide and 0.1 to 1 wt % of zinc oxide is used as a target. Other examples include gold (Au), platinum (Pt), nickel (Ni), tungsten (W), chromium (Cr), molybdenum (Mo), iron (Fe), cobalt (Co), copper (Cu), palladium (Pd), a nitride of a metal material such as titanium nitride, and the like.

The second electrode 104 can be formed using a metal, an alloy, an electrically conductive compound, a mixture of these materials, or the like, having a low work function; specifically, a work function of 3.8 eV or lower is preferable. Specific examples of such a cathode material include an element belonging to Group 1 or Group 2 of the periodic table: an alkali metal such as lithium (Li) or cesium (Cs); an alkaline earth metal such as magnesium (Mg), calcium (Ca), or strontium (Sr); an alloy containing an element from the above metals (MgAg, AlLi); a rare-earth metal such as europium (Eu) or ytterbium (Yb); an alloy of these, and the like. However, when an electron-injecting layer is provided between the second electrode 104 and an electron-transporting layer, the second electrode 104 can be formed using various conductive materials such as Al, Ag, ITO, or indium oxide-tin oxide including silicon or silicon oxide regardless of its work function.

There is no particular limitation on the stacked structure of the EL layer 103, and layers formed using a substance having a high electron-transporting property, a substance having a high hole-transporting property, a substance having a high electron-injecting property, a substance having a high hole-injecting property, a bipolar substance (a substance having a high electron- and hole-transporting properties) and/or the like may be combined with the light-emitting layer described in Embodiment 1, as appropriate. For example, a hole-injecting layer, a hole-transporting layer, a hole-blocking layer, an electron-transporting layer, an electron-injecting layer, and/ or the like may be combined as appropriate with the light-emitting layer described in Embodiment 1. Specific materials to form each of the layers are described below.

FIG. 1 illustrates an example of a structure in which the first electrode 102, a hole-transporting layer 112, a light-emitting layer 113, an electron-transporting layer 114, and the second electrode 104 are stacked in this order.

The hole-transporting layer 112 contains a substance having a high hole-transporting property. The substance having a high hole-transporting property can be an aromatic amine compound such as 4,4'-bis[N-(1-naphthyl)-N-phenylamino] biphenyl (NPB or α-NPD), N,N'-bis(3-methylphenyl)-N,N'-diphenyl-[1,1'-biphenyl]-4,4'-diamine (TPD), 4,4',4"-tris(N,N-diphenylamino)triphenylamine (TDATA), 4,4',4"-tris[N-(3-methylphenyl)-N-phenylamino]triphenylamine (MTDATA), or 4,4'-bis[N-(spiro-9,9'-bifluoren-2-yl)-N-phenylamino]biphenyl (BSPB), or the like. The substances described here mainly have a hole mobility of $10^{-6}$ $cm^2$/Vs or higher; however, other substances may also be used as long as their hole-transporting properties are higher than the electron-transporting properties. Note that the layer containing a substance having a high hole-transporting property is not limited to a single layer, and two or more layers containing the above-described substances may be stacked.

In addition, the hole-transporting layer 112 can also be formed using a high molecular compound such as poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), or poly[N,N'-bis(4-butylphenyl)-N,N'-bis(phenyl)benzidine (Poly-TPD).

The light-emitting layer 113 contains a substance having a high light-emitting property. The light-emitting layer 113 of the light-emitting element of an embodiment of the present invention includes a first layer 121, a second layer 122, and a third layer 123, which are provided in this order on the side of the first electrode 102 that serves as an anode.

The first layer 121 has a hole-transporting property, and contains a first substance that exhibits fluorescence (hereinafter, referred to as a fluorescent compound) and a hole-transporting organic compound. The singlet-excitation energy of the first fluorescent compound is the same as or lower than the singlet-excitation energy of a hole-transporting organic compound.

The second layer 122 is bipolar, and contains a substance that exhibits phosphorescence (hereinafter, referred to as a phosphorescent compound) and a host material. The host material is preferably bipolar. The triplet-excitation energy of the phosphorescent compound is the same as or lower than the triplet-excitation energy of the host material.

The third layer 123 has an electron-transporting property, and contains a second fluorescent compound and an electron-transporting organic compound. The singlet-excitation energy of the second fluorescent compound is the same as or lower than the singlet-excitation energy of the electron-transporting organic compound.

With such a structure, when voltage is applied to the first electrode 102 and the second electrode 104 such that the potential of the first electrode 102 is higher than the potential of the second electrode 104, recombination regions are formed in two places: in the vicinity of the interface between the first layer 121 and the second layer 122, and in the vicinity of the interface between the second layer 122 and the third layer 123.

That is, as illustrated in FIG. 2, holes injected from the first electrode 102 are transported through the hole-transporting layer 112 to the first layer 121. Since the first layer 121 has a hole-transporting property, the holes are transported through the first layer 121. Since the second layer 122 is bipolar, a part of the holes is transported to the vicinity of the interface between the second layer 122 and the third layer 123. On the other hand, electrons injected from the second electrode 104 are transported through the electron-transporting layer 114 to the third layer 123. Since the third layer 123 has an electron-transporting property, the electrons are transported through the third layer 123. Since the second layer 122 is bipolar, a part of the electrons is transported to the vicinity of the interface between the second layer 122 and the first layer 121. Accordingly, the holes and the electrons are recombined mainly in two places: in the vicinity of the interface between the first layer 121 and the second layer 122, and in the vicinity of the interface between the second layer 122 and the third layer 123. Obviously, a part of carriers is recombined in the second layer 122.

In a recombination region 131 and a recombination region 132, an exciton in a singlet excited state (S*) and an exciton in a triplet excited state (T*) are generated, and its statistical generation ratio is S*:T*=1:3. The energy of the exciton in a singlet excited state generated in the recombination region 131 is transferred to a singlet excited state of the first fluorescent compound contained in the first layer 121, and the first fluorescent compound emits light. In addition, the energy of the exciton in a singlet excited state generated in the recombination region 132 is transferred to a singlet excited state of the second fluorescent compound contained in the third layer 123, and the second fluorescent compound emits light.

On the other hand, in conventional light-emitting elements, the excitons in a triplet excited state generated in the recombination region 131 and the recombination region 132 are deactivated without contributing to light emission. Alternatively, as described in Non-Patent Document 1, only a part of the energy of the triplet excited state is used.

In the light-emitting element of an embodiment of the present invention, the triplet-excitation energy (the energy difference between a ground state and a triplet excited state) of the hole-transporting organic compound contained in the first layer 121 is greater than the triplet-excitation energy of the host material contained in the second layer 122. With the above structure, the exciton energy of the triplet excited state generated in the recombination region 131 can be transferred to the second layer 122, and their energy can be transferred to the triplet excited state of the host material contained in the second layer 122. In addition, the triplet-excitation energy of the electron-transporting organic compound contained in the third layer 123 is greater than the triplet-excitation energy of the host material contained in the second layer 122. With the above structure, the exciton energy of the triplet excited state generated in the recombination region 132 can be transferred to the second layer 122, and their energy can be transferred to the triplet excited state of the host material contained in the second layer 122. In addition, since the triplet-excitation energy of the hole-transporting organic compound contained in the first layer 121 and the triplet-excitation energy of the electron-transporting organic compound contained in the third layer 123 are greater than the triplet-excitation energy of the host material contained in the second layer 122, the triplet-excitation energy of the host material generated in the second layer 122 is efficiently confined within the second layer 122.

As a result, the triplet-excitation energy of the host material contained in the second layer 122 is transferred to the triplet-excitation state of the phosphorescent compound, and the phosphorescent compound emits light.

That is, by the application of an embodiment of the present invention, the excitons in the singlet excited state and the excitons in the triplet excited state generated in the recombination region 131 and the recombination region 132 can be more effectively used in light emission.

In addition, as described above, a part of the electrons and holes is also recombined in the second layer 122 and excitons are generated. Therefore, by the recombination of the carriers, the phosphorescent compound contained in the second layer 122 also emits light. Accordingly, high luminous efficiency can be realized.

In the light-emitting element of an embodiment of the present invention, by adapting the above-mentioned structure of the light emitting layer 113, the main recombination regions can be limited to the two regions: the recombination region 131 and the recombination region 132. Accordingly, the probability of the recombination of carriers in the recombination region can be increased, and emission balance can be enhanced. The emission balance can be further enhanced by adjusting the thicknesses of each of the layers: the first layer 121, the second layer 122, and the third layer 123.

Figure 3A:
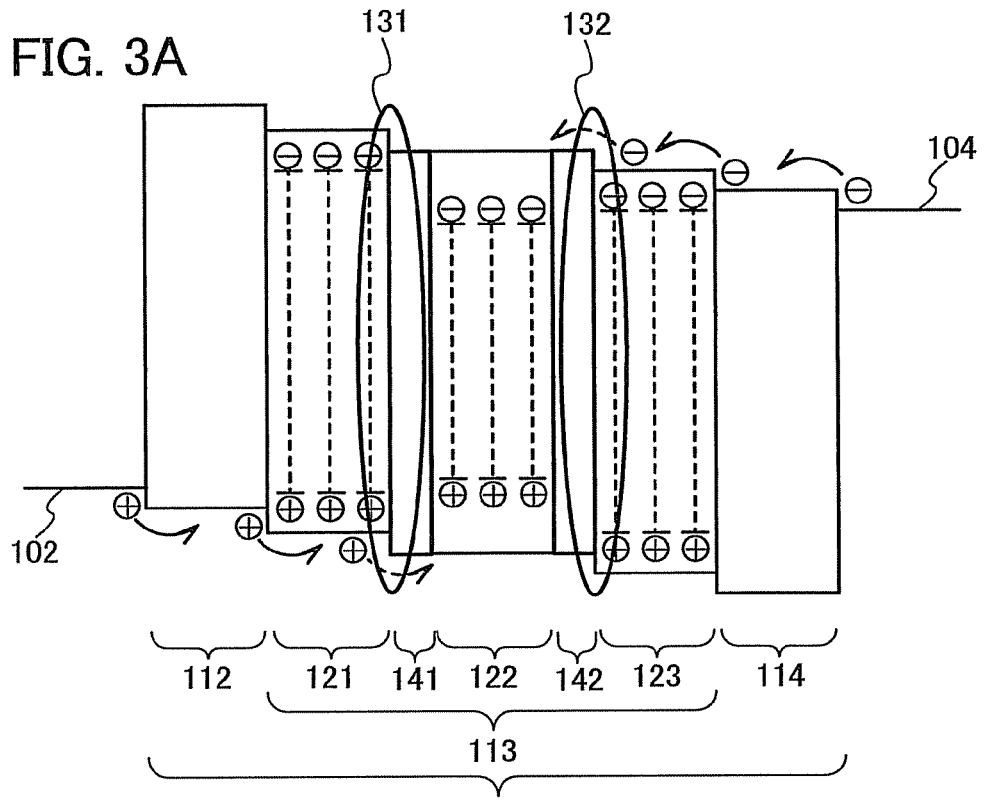
FIGS. 3A and 3B are band diagrams of a light-emitting element according to one embodiment of the present invention.

In the above structure, as illustrated in FIG. 3A, a spacing layer 141 comprising a bipolar organic compound contained in the second layer 122 is preferably provided between the first layer 121 and the second layer 122. The spacing layer 141 makes it easy to adjust the distance between the recombination region 131 and the second layer 122. As a result, emission intensity from the second layer 122 can be adjusted easily in accordance with the energy transfer from the triplet excited state. In addition, the singlet-excitation energy of the first fluorescent compound contained in the first layer 121 can be prevented from being transferred to the phosphorescent compound contained in the second layer 122 through the Förster energy transfer. Further, by using the bipolar organic compound as the spacing layer 141, balance of carriers can be sustained and the spacing layer can be easily formed.

Similarly, as shown in FIG. 3A, a spacing layer 142 comprising a bipolar organic compound contained in the second layer 122 is preferably provided between the second layer 122 and the third layer 123. The spacing layer 142 makes it easy to adjust the distance between the recombination region 132 and the second layer 122. As a result, emission intensity from the second layer 122 can be adjusted easily in accordance with the energy transfer from the triplet excited state. In addition, the singlet-excitation energy of the second fluorescent compound contained in the third layer 123 can be prevented from being transferred to the phosphorescent compound contained in the second layer 122 through the Förster energy transfer. Further, by using the bipolar organic compound as the spacing layer 142, balance of carriers can be sustained and the spacing layer can be easily formed.

The thickness of each of the spacing layers is preferably from 1 nm to 30 nm, inclusive. If the thickness is more than 30 nm, the triplet exciton energy cannot be transferred from the recombination regions to the second layer; accordingly, light emission from the second layer becomes weak. Therefore, the thickness of each of the spacing layers is preferably from 1 nm to 30 nm, inclusive.

In addition, the thickness of the second layer is preferably from 5 nm to 20 nm, inclusive. If the second layer is too thick, balance of the light emission from the first layer and the third layer is disturbed. If the second layer is too thin, the light emission from the second layer becomes weak. Therefore, by setting the thickness of the second layer to the above range, the light emission from the first layer, the second layer, and the third layer can be obtained with an excellent balance.

In addition, in the above structure, the first fluorescent organic compound and the second fluorescent organic compound are preferably the same organic compound; accordingly, the manufacture of the light-emitting element becomes easy.

In addition, with the light-emitting element of an embodiment of the present invention, light emission can be obtained from a plurality of substances having a high light-emitting property; accordingly, the light-emitting element of an embodiment of the present invention can be suitably applied to a white emissive light-emitting element. By applying the light-emitting element of an embodiment of the present invention to the white emissive light-emitting element, a highly efficient white emissive light-emitting element can be obtained.

For example, in the above structure, it is preferable that the first fluorescent compound and the second fluorescent compound be the same organic compound and that the emission color of the first fluorescent compound and the second fluorescent compound and the emission color of the phosphorescent compound be complementary colors. With such a structure, the white emissive light-emitting element can be obtained and the manufacture of the light-emitting element becomes easy.

Note that the term "complementary colors" means the colors in such a relation that they become an achromatic color when they are mixed. That is, when complementary colored light emitted from substances is mixed, white-light emission can be obtained.

Figure 3B:
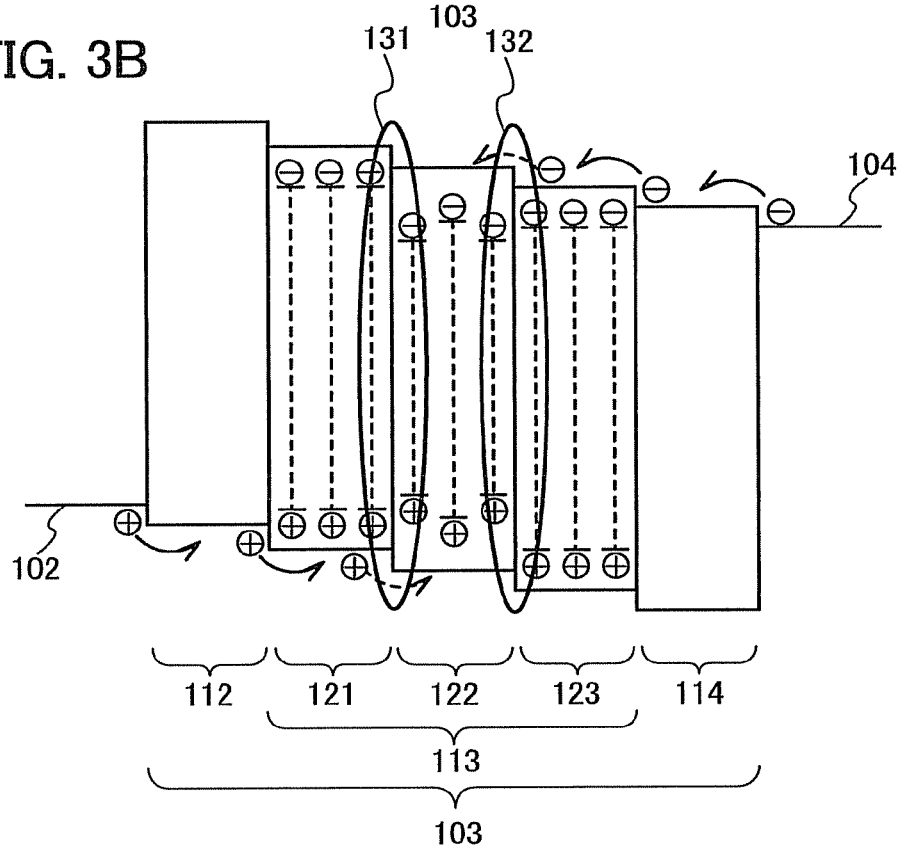

In addition, as illustrated in FIG. 3B, the second layer 122 may contain plural types of phosphorescent compounds. Since the second layer 122 contains the plural types of the phosphorescent compounds, a white emissive light-emitting element having a higher color-rendering property can be obtained. For example, in a case where the first fluorescent compound and the second fluorescent compound are the same organic compound, the emission color of the first fluorescent organic compound and the second fluorescent organic compound is blue, the emission color of a phosphorescent compound among plural types is green and the emission color of another phosphorescent compound is red, the white emissive light-emitting element having a higher color-rendering property can be obtained.

A variety of materials can be used for the phosphorescent compound in the second layer 122. An example of a blue emissive light-emitting phosphorescent compound is an organometallic complex such as bis[2-(4',6'-difluorophenyl)pyridinato-N,C$^{2'}$]iridium(III)tetrakis (1-pyrazolyl)borate (FIr6), bis[2-(4',6'-difluorophenyl)pyridinato-N,C$^{2'}$]iridium (III)picolinate (FIrpic); bis[2-(3',5'bistrifluoromethylphenyl) pyridinato-N,C$^{2'}$]iridium(III)picolinate (Ir(CF$_3$ppy)$_2$(pic)), or bis[2-(4',6'-difluorophenyl)pyridinato-N,C$^{2'}$]iridium(III) acetylacetonate (FIr(acac)). An example of a green emissive light-emitting phosphorescent compound is an organometallic complex such as tris(2-phenylpyridinato-N,C$^{2'}$)iridium (III) (Ir(ppy)$_3$), bis(2-phenylpyridinato-N,C$^{2'}$)iridium(III) acetylacetonate (Ir(ppy)$_2$(acac)), bis(1,2-diphenyl-1H-benzimidazolato)iridium(III)acetylacetonate (Ir(pbi)$_2$(acac)) or bis(benzo[h]quinolinato)iridium(III)acetylacetonate (Ir (bzq)$_2$(acac)). An example of a yellow-light-emitting phosphorescent compound is an organometallic complex such as bis(2,4-diphenyl-1,3-oxazolato-N,C$^{2'}$)iridium(III)acetylacetonate (Ir(dpo)$_2$(acac)), bis[2-(4'-perfluorophenylphenyl) pyridinato]iridium(III)acetylacetonate (Ir(p-PF-ph)$_2$(acac)), or bis(2-phenylbenzothiazolato-N,C$^{2'}$)iridium(III)acetylacetonate (Ir(bt)$_2$(acac)). An example of an orange-light-emitting phosphorescent compound is an organometallic complex such as tris(2-phenylquinolinato-N,C$^{2'}$)iridium(III) (Ir(pq)$_3$), bis(2-phenylquinolinato-N,C$^{2'}$)iridium(III)acetylacetonate (Ir(pq)$_2$(acac)), or (acetylacetonato)bis(3,5-dimethyl-2-phenylpyrazinato)iridium(III) ([Ir(mppr-Me)$_2$(acac)]). An example of a red emissive light-emitting phosphorescent compound is an organometallic complex such as bis[2-(2'-benzo[4,5-α]thienyl)pyridinato-N,C$^{3'}$)iridium(III)acetylacetonate (Ir(btp)$_2$(acac)), bis(1-phenylisoquinolinato-N,C$^{2'}$) iridium(III)acetylacetonate (Ir(piq)$_2$(acac)), (acetylacetonato)bis[2,3-bis(4-fluorophenyl)quinoxalinato] iridium(III) (Ir(Fdpq)$_2$(acac)), or 2,3,7,8,12,13,17,18-octaethyl-21H,23H-porphyrinplatinum(II) (PtOEP). In addition, an example of the phosphorescent compound is a rare-earth metal complex such as tris(acetylacetonato)(monophenanthroline)terbium(III) (Tb(acac)$_3$(Phen)), tris(1,3-diphenyl-1, 3-propanedionato)(monophenanthroline)europium(III) (Eu (DBM)$_3$(Phen)), or tris[1-(2-thenoyl)-3,3,3-trifluoroacetonato](monophenanthroline)europium(III) (Eu (TTA)$_3$(Phen)), because the rare-earth metal complexes perform light emission from a rare-earth metal ion as a result of electron transition between different multiplicities.

In addition, a variety of materials can be used for the fluorescent compound in the first layer 121 and the third layer 123. A blue emissive light-emitting fluorescent compound can be N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), 2,5,8,11-tetra(tert-butyl)perylene (TBP), or the like. A green emissive light-emitting fluorescent compound can be N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2PCABPhA), N-(9,10-diphenyl-2-anthryl)-N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), 9,10-bis(1,1'-biphenyl-2-yl)]-N-[4-(9H-carbazol-9-yl)phenyl]-N-phenylanthracen-2-amine (2YGABPhA), N,N,9-triphenylanthracen-9-amine (DPhAPhA), or the like. A yellow-light-emitting fluorescent compound can be rubrene, 5,12-bis(1,1'-biphenyl-4-yl)-6,11-diphenyltetracene (BPT), or the like. A red emissive light-emitting fluorescent compound can be N,N,N',N'-tetrakis(4-methylphenyl)tetracene-5,11-diamine (p-mPhTD), 7,13-diphenyl-N,N, N',N'-tetrakis(4-methylphenyl)acenaphtho[1,2-a] fluoranthene-3,10-diamine (p-mPhAFD), or the like.

A variety of materials can be used for the hole-transporting organic compound in the first layer 121. The material can be an aromatic amine compound such as 4,4'-bis[N-(1-naphthyl)-N-phenylamino]biphenyl (NPB or α-NPB), N,N'-bis (3-methylphenyl)-N,N'-diphenyl-[1,1'-biphenyl]-4,4'-diamine (TPD), 4,4',4''-tris(N,N-diphenylamino) triphenylamine (TDATA), 4,4',4''-tris [N-(3-methylphenyl)-N-phenylamino]triphenylamine (MTDATA), or 4,4'-bis[N-(spiro-9,9'-bifluoren-2-yl)-N-phenylamino]biphenyl (BSPB), or the like. The substances described here mainly have a hole mobility of 10$^{-6}$ cm$^2$/Vs or higher; however, other substances may also be used as long as their hole-transporting properties are higher than the electron-transporting properties. In addition, the material can also be a high molecular compound such as poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), or poly[N,N'-bis(4-butylphenyl)-N,N'-bis(phenyl)benzidine] (Poly-TPD).

A variety of materials can be used for the electron-transporting organic compound in the third layer 123. The material can be, for example, a metal complex having a quinoline or benzoquinoline skeleton, such as tris(8-quinolinolato)aluminum (Alq), tris(4-methyl-8-quinolinolato)aluminum (Almq$_3$), bis(10-hydroxybenzo [h]quinolinato)beryllium (BeBq$_2$), or bis(2-methyl-8-quinolinolato)(4-phenylphenolato)aluminum (BAlq); a metal complex having an oxazole-based or thiazole-based ligand, such as bis[2-(2-hydroxyphenyl)benzoxazolato]zinc (Zn(BOX)$_2$) or bis[2-(2-hydroxyphenyl)-benzothiazolato]zinc (Zn(BTZ)$_2$); 2-(4-biphenylyl)-5-(4-tert-butylphenyl)-1,3,4-oxadiazole (PBD); 1,3-bis[5-(p-tert-butylphenyl)-1,3,4-oxadiazol-2-yl]benzene (OXD-7); 9-[4-(5-phenyl-1,3,4-oxadiazol-2-yl)phenyl]-9H-carbazole (CO11); bathophenanthroline (BPhen), bathocuproine (BCP); or the like. The substances described here mainly have an electron mobility of 10$^{-6}$ cm$^2$/Vs or higher; however, other substances may also be used as long as their electron-transporting properties are higher than the hole-transporting properties. The material can also be a high molecular compound such as poly[(9,9-dihexylfluorene-2,7- diyl)-co-(pyridine-3,5-diyl)] (PF-Py) or poly[(9,9-dioctylfluorene-2,7-diyl)-co-(2,2'-bipyridine-6,6'-diyl)] (PF-BPy).

As described above, a bipolar organic compound is preferably used for the host material in the second layer 122. In consideration of the bipolar property which allows the acceptance of both holes and electrons, it is preferable to use a substance that includes both an electron-rich skeleton such as an aromatic amine skeleton and a π-electron-rich heteroaromatic ring (pyrrole, indole, carbazole, dibenzofuran, dibenzothiophene, or the like) and an electron-poor skeleton such as a π-electron-poor heteroaromatic ring (pyridine, quinoline, quinoxaline, diazole, triazole, or the like), simultaneously. Examples thereof include the following: 4,4'-(quinoxaline-2,3-diyl)bis(N,N-diphenylaniline) (TPAQn), N,N'-(quinoxaline-2,3-diyldi-4,1-phenylene)bis (N-phenyl-1,1'-biphenyl-4-amine) (BPAPQ), N,N'-(quinoxaline-2,3-diyldi-4,1-phenylene)bis[bis(1,1'-biphenyl-4-yl)amine] (BBAPQ), 4,4'-(quinoxaline-2,3-diyl)bis{N-[4-(9H-carbazol-9-yl)phenyl]-N-phenylaniline} (YGAPQ), N,N'-(quinoxaline-2,3-diyldi-4,1-phenylene)bis(N,9-diphenyl-9H-carbazole-3-amine) (PCAPQ), 2-{4-[N-(biphenyl-4-yl)-N-phenylamino]phenyl}-3-phenylquinoxaline (BPA1PQ), 4-(9H-carbazol-9-yl)-4'-(3-phenylquinoxalin-2-yl)triphenylamine (YGA1PQ), N,9-diphenyl-N-[4-(3-phenylquinoxalin-2-yl)phenyl]-9H-carbazole-3-amine (PCA1PQ), N,N,N'-triphenyl-N'[4-(3-phenylquinoxalin-2-yl)phenyl]-1,4-phenylenediamine (DPA1PQ), 9-[4-(5-phenyl-1,3,4-oxadiazol-2-yl)phenyl]-9H-carbazole (CO11), 4-(9H-carbazole-9-yl)-4'-(5-phenyl-1,3,4-oxadiazole-2-yl)triphenylamine) (YGAO11), N,9-diphenyl-N-[4-(5-phenyl-1,3,4-oxadiazol-2-yl)phenyl]-9H-carbazole-3-amine (PCAO11), N,N,N'-triphenyl-N'-[4-(5-phenyl-1,3,4-oxadiazol-2-yl)phenyl]-1,4-phenylenediamine (DPAO11), 4-(9H-carbazol-9-yl)-4'-(4,5-diphenyl-4H-1,2,4-triazol-3-yl)triphenylamine (YGATAZ1), 4-(9H-carbazol-9-yl)-4'-(3,5-diphenyl-4H-1,2,4-triazol-4-yl)triphenylamine (YGATAZ2), and the like.

For example, 2,5,8,11-tetra(tert-butyl)perylene (TBP) that emits blue light can be used as the first fluorescent compound in the first layer; 4,4'-bis[N-(1-naphthyl)-N-phenylamino]biphenyl (NPB), the hole-transporting compound; (acetylacetonato)bis(3,5-dimethyl-2-phenylpyrazinato)iridium(III) ([Ir(mppr-Me)$_2$(acac)]) that emits orange light, the phosphorescent compound in the second layer; 2-{4-[N-(biphenyl-4-yl)-N-phenylamino]phenyl}-3-phenylquinoxaline (BPA1PQ), the host material; IBP that is the same as the first fluorescent compound, the second fluorescent compound in the third layer; and 9-[4-(5-phenyl-1,3,4-oxadiazol-2-yl)phenyl]-9H-carbazole (CO11), the electron-transporting compound, to obtain a white emissive light-emitting element to which an embodiment of the present invention is applied. Since the triplet-excitation energy of CO11 is greater than the triplet-excitation energy of NBP, and the triplet-excitation energy of NPB is greater than the triplet-excitation energy of BPA1PQ, the energy can be transferred to the triplet excited state of BPA1PQ that is the host material in the second layer. In addition, since the triplet-excitation energy of the host material generated in the second layer is efficiently confined within the second layer 122, high luminous efficiency can be realized.

The electron-transporting layer 114 contains a substance having a high electron-transporting property. The substance having a high electron-transporting property can be, for example, a metal complex having a quinoline skeleton or a benzoquinoline skeleton, such as tris(8-quinolinolato)aluminum (Alq), tris(4-methyl-8-quinolinolato)aluminum (Almq$_3$), bis(10-hydroxybenzo[h]quinolinato)beryllium (BeBq$_2$), or bis(2-methyl-8-quinolinolato)(4-phenylphenolato)aluminum (BAlq); an metal complex having an oxazole-based or thiazole-based ligand, such as bis[2-(2-hydroxyphenyl)benzoxazolato]zinc (Zn(BOX)$_2$) or bis[2-(2-hydroxyphenyl)benzothiazolato]zinc (Zn(BTZ)$_2$); 2-(4-biphenylyl)-5-(4-tert-butylphenyl)-1,3,4-oxadiazole (PBD); 1,3-bis[5-(p-tert-butylphenyl)-1,3,4-oxadiazol-2-yl]benzene (OXD-7); 9-[4-(5-phenyl-1,3,4-oxadiazol-2-yl)phenyl]carbazole (CO11); 3-(4-biphenylyl)-4-phenyl-5-(4-tert-butylphenyl)-1,2,4-triazole (TAZ); bathophenanthroline (BPhen); bathocuproine (BCP); or the like. The substances described here mainly have an electron mobility of $10^{-6}$ cm$^2$/Vs or higher; however, other substances may also be used as long as their electron-transporting properties are higher than the hole-transporting properties. In addition, the electron-transporting layer is not limited to a single layer, and two or more layers made of the above-described substances may be stacked.

In addition, materials for the electron-transporting layer 114 can also be a high molecular compound such as poly[(9,9-dihexylfluorene-2,7-diyl)-co-(pyridine-3,5-diyl)](PF-Py) or poly[(9,9-dioctylfluorene-2,7-diyl)-co-(2,2'-bipyridine-6,6'-diyl)](PF-BPy).

Figure 4:
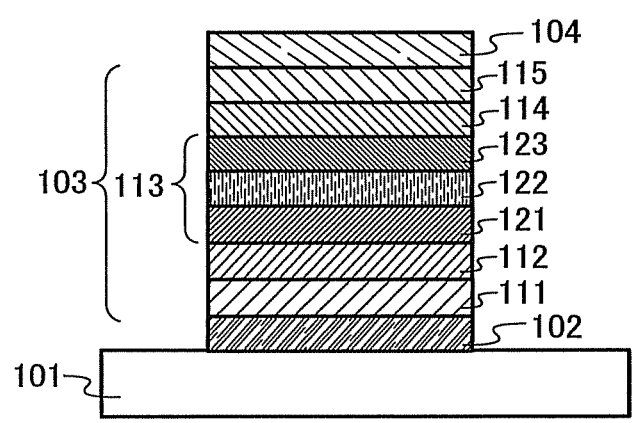
FIG. 4 illustrates a light-emitting element according to one embodiment of the present invention.

As illustrated in FIG. 4, a hole-injecting layer III may be provided between the first electrode 102 and the hole-transporting layer 112. Examples of a substance having a high hole-injecting property used for the hole-injecting layer include molybdenum oxide, vanadium oxide, ruthenium oxide, tungsten oxide, manganese oxide; a phthalocyanine-based compound such as phthalocyanine (H$_2$Pc) or copper phthalocyanine (CuPc), a polymer such as poly(3,4-ethylenedioxythiophene)/poly(styrenesulfonic acid) (PEDOT/PSS), and the like.

A composite material formed by mixing an acceptor substance into a substance having a high hole-transporting property can also be used for the hole-injecting layer 111. Note that, by using the material having a high hole-transporting property containing an acceptor material, a material for forming an electrode may be selected regardless of its work function. In other words, in addition to a material having a high work function, a material having a low work function may be used for the first electrode 102. Examples of the acceptor substance include 7,7,8,8-tetracyano-2,3,5,6-tetrafluoroquinodimethane (F$_4$-TCNQ), chloranil, a transition metal oxide, and an oxide of a metal that belongs to Group 4 to 8 of the periodic table. Specifically, substances having a high electron-accepting property such as vanadium oxide, niobium oxide, tantalum oxide, chromium oxide, molybdenum oxide, tungsten oxide, manganese oxide, or rhenium oxide are preferable. Among these, molybdenum oxide is especially preferable because of its stability in the air, low hygroscopic property, and easiness in treating.

Note that, in the present specification, the term "composition" means not only a mixture of two materials but also a mixture of a plurality of materials in a condition where charge transfer occurs between the materials.

The organic compound used for the composite material can be various compounds such as an aromatic amine compound, a carbazole derivative, aromatic hydrocarbon, or a high molecular compound (oligomer, dendrimer, polymer, or the like). Note that the organic compound used for the composite material is preferably an organic compound having a high hole-transporting property. Specifically, a substance having a hole mobility of $10^{-6}$ cm$^2$/Vs or higher is preferably used; however, other substances may also be used as long as their hole-transporting properties are higher than the electron-transporting properties. Organic compounds that can be used for the composite material are specifically listed below.

Examples of the aromatic amine compound to be used for the composite material include N,N'-bis(4-methylphenyl)-N,N'-diphenyl-p-phenylenediamine (DTDPPA), 4,4'-bis[N-(4-diphenylaminophenyl)-N-phenylamino]biphenyl (DPAB), 4,4'-bis[N-(3-methylphenyl)-N-phenylamino]biphenyl (DNTPD), 1,3,5-tris[N-(4-diphenylaminophenyl)-N-phenylamino]benzene (DPA3B), and the like.

Examples of the carbazole derivative to be used for the composite material include 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and the like.

Other examples of a carbazole derivative to be used for the composite material include 4,4'-di(N-carbazolyl)biphenyl (CBP), 1,3,5-tris[4-(N-carbazolyl)phenyl]benzene (TCPB), 9-[4-(10-phenyl-9-anthracenyl)phenyl]-9H-carbazole (CzPA), 1,4-bis[4-(N-carbazolyl)phenyl]-2,3,5,6-tetraphenylbenzene; and the like.

Examples of the aromatic hydrocarbon to be used for the composite material include 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. In addition, pentacene, coronene, or the like can also be used. An aromatic hydrocarbon having a hole mobility of $1 \times 10^{-6}$ cm$^2$/Vs or higher and having 14 to 42 carbon atoms is more preferably used.

Note that the aromatic hydrocarbon that can be used for the composite material may have a vinyl skeleton. Examples of the aromatic hydrocarbon having a vinyl group include 4,4'-bis(2,2-diphenylvinyl)biphenyl (DPVBi), 9,10-bis[4-(2,2-diphenylvinyl)phenyl]anthracene (DPVPA), and the like.

In addition, a high molecular compound such as poly(N-vinylcarbazole) (PVK) or poly(4-vinyltriphenylamine) (PVTPA) can also be used.

As illustrated in FIG. 4, an electron-injecting layer 115 may be provided between the electron-transporting layer 114 and the second electrode 104. Examples of a material for the electron-injecting layer 115 include an alkali metal, an alkaline earth metal, and a compound of these metals, such as lithium fluoride (LiF), cesium fluoride (CsF), or calcium fluoride (CaF$_2$). The material can be a layer containing an electron-transporting substance doped with an alkali metal, an alkaline earth metal, or a compound thereof; for example, an Alq layer containing magnesium (Mg). It is preferable that the layer containing the electron-transporting substance and an alkali metal or an alkaline earth metal be used as the electron-injecting layer 115 because electron injection from the second electrode 104 proceeds efficiently.

The EL layer 103 can be formed by various methods. Either a wet process or a dry process, for example, a vacuum evaporation method, an ink-jet method, a spin coating method, or the like may be employed. Further, each of the electrodes or the layers may be formed by a different method.

In the above structure of the light-emitting element of an embodiment of the present invention, a potential difference is applied between the first electrode 102 and the second electrode 104 to allow current to flow, and holes and electrons are recombined in the EL layer 103, resulting in light emission. More specifically, in the above structure, a light-emitting region is formed in the light-emitting layer 113 in the EL layer 103.

Figure 5A:
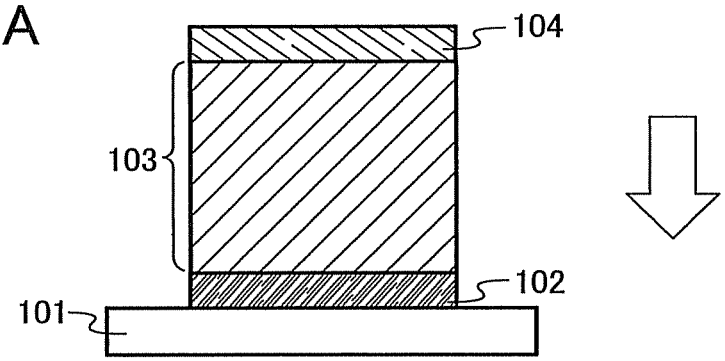
FIGS. 5A to 5C illustrate a light-emitting element according to one embodiment of the present invention.
Figure 5B:
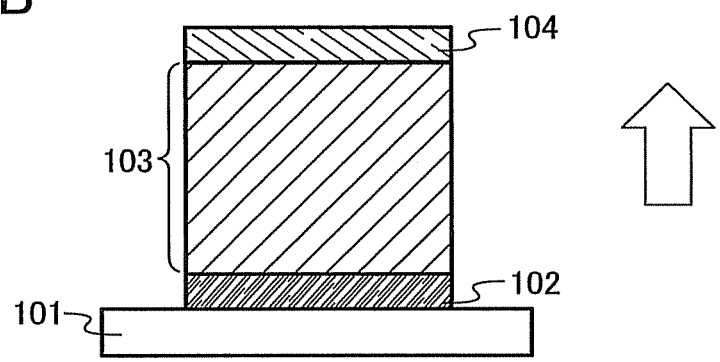
Figure 5C:
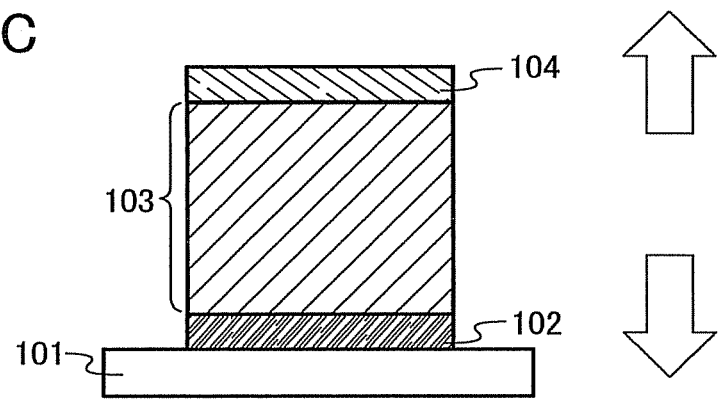

The emitted light passes through either or both of the first electrode 102 or/and the second electrode 104 and is extracted. Accordingly, either or both the first electrode 102 and the second electrode 104 has/have a light-transmitting property. When only the first electrode 102 has a light-transmitting property, as illustrated by an arrow in FIG. 5A, the emitted light passes through the first electrode 102 and is extracted from the substrate side. On the other hand, when only the second electrode 104 has a light-transmitting property, as illustrated by an arrow in FIG. 5B, the emitted light passes through the second electrode 104 and is extracted from the opposite side to the substrate side. Further, when both the first electrode 102 and the second electrode 104 have a light-transmitting property, as illustrated by an arrow in FIG. 5C, the emitted light passes through both the first electrode 102 and the second electrode 104 and is extracted from the both of the sides, i.e., the substrate side and the opposite side.

Note that the structure of EL layer 103 provided between the first electrode 102 and the second electrode 104 is not limited to the above example. Other structures may also be used as long as the light-emitting region where holes and electrons are recombined is provided in a portion apart from the first electrode 102 and the second electrode 104 in order to prevent quenching by the adjacency of the light-emitting region and the first electrode 102 or the second electrode 104, and as long as the light-emitting layer 113 has the above-described structure.

In other words, there is no particular limitation on a stacked structure of the EL layer 103. The light-emitting layer 113 of an embodiment of the present invention may be combined freely with layers formed using a substance having a high electron-transporting property, a substance having a high hole-transporting property, a substance having a high electron-injecting property, a substance having a high hole-injecting property, a bipolar substance (a substance having high electron- and hole-transporting properties), a hole-blocking material, or the like.

Figure 6:
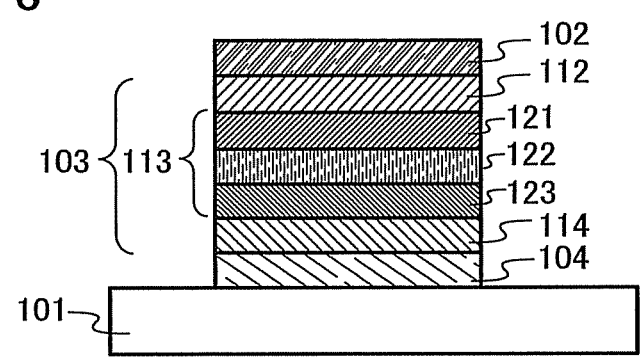
FIG. 6 illustrates a light-emitting element according to one embodiment of the present invention.

The light-emitting element illustrated in FIG. 6 has a structure in which the second electrode 104 serving as the cathode, the EL layer 103, and the first electrode 102 serving as the anode are stacked in this order on the substrate 101. The EL layer 103 includes the hole-transporting layer 112, the light-emitting layer 113, and the electron-transporting layer 114. The light-emitting layer 113 includes the first layer 121, the second layer 122, and the third layer 123, provided in this order on the first electrode 102 side.

In this embodiment, the light-emitting element is formed on a substrate made with glass, plastic, or the like. By forming a plurality of such light-emitting elements on one substrate, a passive-matrix light-emitting device can be manufactured. Alternatively, for example, a thin film transistor (TFT) may be formed on the substrate made with glass, plastic, or the like, and the light-emitting element may be formed on an electrode electrically connected to the TFT. Thus, an active-matrix light-emitting device in which the operation of the light-emitting element is controlled by the TFT can be manufactured. Note that a structure of the TFT is not particularly limited. The TFT may be either a staggered type or an inverted staggered type. A driver circuit formed on the TFT substrate may be formed using either or both n-channel TFTs or/and p-channel TFTs. In addition, crystallinity of a semiconductor film used for the TFT is not particularly limited also. Either an amorphous semiconductor film or a crystalline semiconductor film may be used for the TFT.

In the light-emitting element of an embodiment of the present invention, the effective use of the excitons in a singlet excited state and a triplet excited state generated in the recombination regions can result in high luminous efficiency. In addition, adjusting the position of the carrier recombination regions can result in higher luminous efficiency.

Further, the high luminous efficiency can result in low power consumption of the light-emitting element.

Note that this embodiment can be combined with another embodiment, as appropriate.

Embodiment 2

In Embodiment 2, a light-emitting element (a stacked type element) in which a plurality of light-emitting units according to an embodiment of the present invention are stacked is described with reference to FIG. 7. This light-emitting element includes a plurality of light-emitting units between a first electrode and a second electrode. The light-emitting unit may have a structure similar to the EL layer described in Embodiment 1 as long as it includes at least a light-emitting layer. In other words, the light-emitting element described in Embodiment 1 includes one light-emitting unit, whereas a light-emitting element described in Embodiment 2 includes a plurality of light-emitting units.

Figure 7:
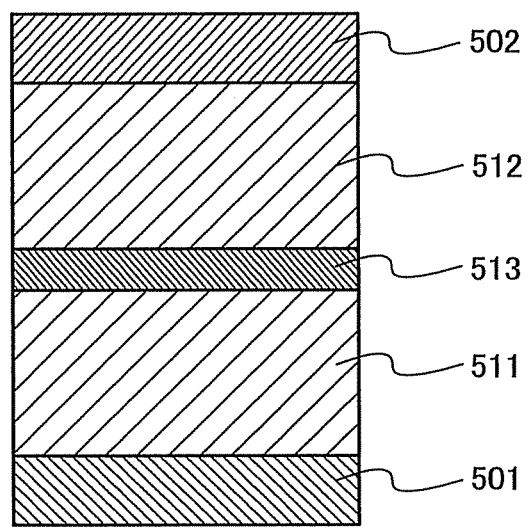
FIG. 7 illustrates a light-emitting element according to one embodiment of the present invention.

In FIG. 7, a first light-emitting unit 511 and a second light-emitting unit 512 are stacked between a first electrode 501 and a second electrode 502, and a charge-generating layer 513 is provided between the first light-emitting unit 511 and the second light-emitting unit 512. The electrodes similar to the electrodes described in Embodiment 1 can be applied to the first electrode 501 and the second electrode 502. The first light-emitting unit 511 and the second light-emitting unit 512 may have the same structure or different structures, and the structure described in Embodiment 1 can be applied.

The charge-generating layer 513 includes a composite material of an organic compound and a metal oxide. The composite material of an organic compound and a metal oxide is the composite material described in Embodiment 1, and includes an organic compound and a metal oxide such as vanadium oxide, molybdenum oxide, or tungsten oxide. Examples of the organic compound include various compounds such as an aromatic amine compound, a carbazole derivative, aromatic hydrocarbon, or a high molecular compound such as oligomer, dendrimer, or polymer. Note that the organic compound having a hole mobility of $10^{-6}$ cm$^2$/Vs or higher is preferably used as a hole-transporting organic compound; however, other substances may also be used as long as their hole-transporting properties are higher than the electron-transporting properties. Since the composite material of an organic compound and a metal oxide has a superior carrier-injecting property and carrier-transporting property, low-voltage driving and low-current driving can be realized.

Note that the charge-generating layer 513 may be formed by combining a composite material of an organic compound and a metal oxide with other materials. For example, the charge-generating layer 513 may be formed with a combination of a layer containing the composite material of an organic compound and a metal oxide and a layer containing a compound having a high electron-transporting property and an electron-donating substance with respect to the compound having the high electron-transporting property. Alternatively, the charge-generating layer 513 may be formed with a combination of a layer containing the composite material of an organic compound and a metal oxide and a transparent conductive film.

In any case, the essential requirements of the charge-generating layer 513 between the first light-emitting unit 511 and the second light-emitting unit 512 are to inject electrons to one light-emitting unit and to inject holes to the other light-emitting unit when voltage is applied to the first electrode 501 and the second electrode 502. For example, in FIG. 7, the essential requirements of the charge-generating layer 513 are to inject electrons to the first light-emitting unit 511 and to inject holes to the second light-emitting unit 512 when voltage is applied such that the potential of the first electrode 501 is higher than the potential of the second electrode 502.

In Embodiment 2, the light-emitting element having two light-emitting units is described; however, the embodiment of the present invention can be similarly applied to a light-emitting element in which three or more light-emitting units are stacked. In the light-emitting element according to Embodiment 2, since the charge-generating layer is arranged between a plurality of light-emitting units between a pair of electrodes so as to partition the light-emitting units, its current density can be kept low and high luminance emission can be achieved; accordingly, a long-life light-emitting element can be realized.

Note that this embodiment can be combined with another embodiment, as appropriate.

Embodiment 3

In Embodiment 3, a light-emitting device including a light-emitting element of an embodiment of the present invention is described.

Figure 8A:
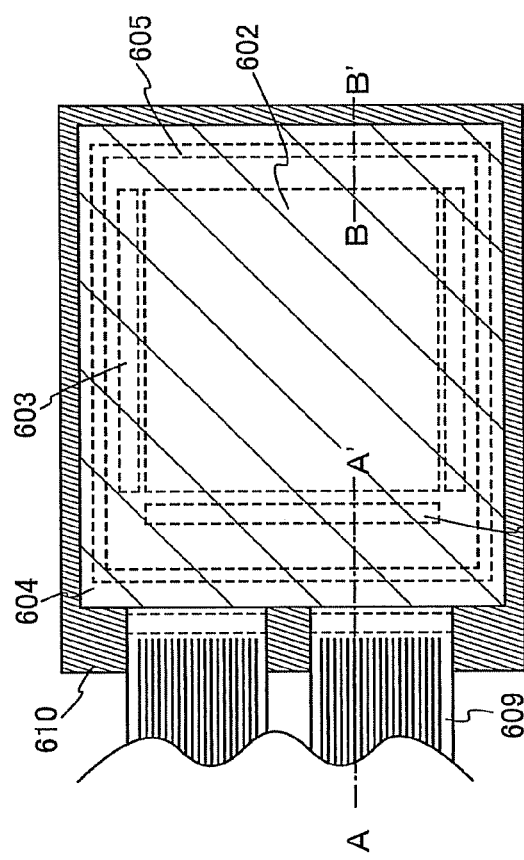
FIGS. 8A and 8B illustrate a light-emitting device according to one embodiment of the present invention.
Figure 8B:
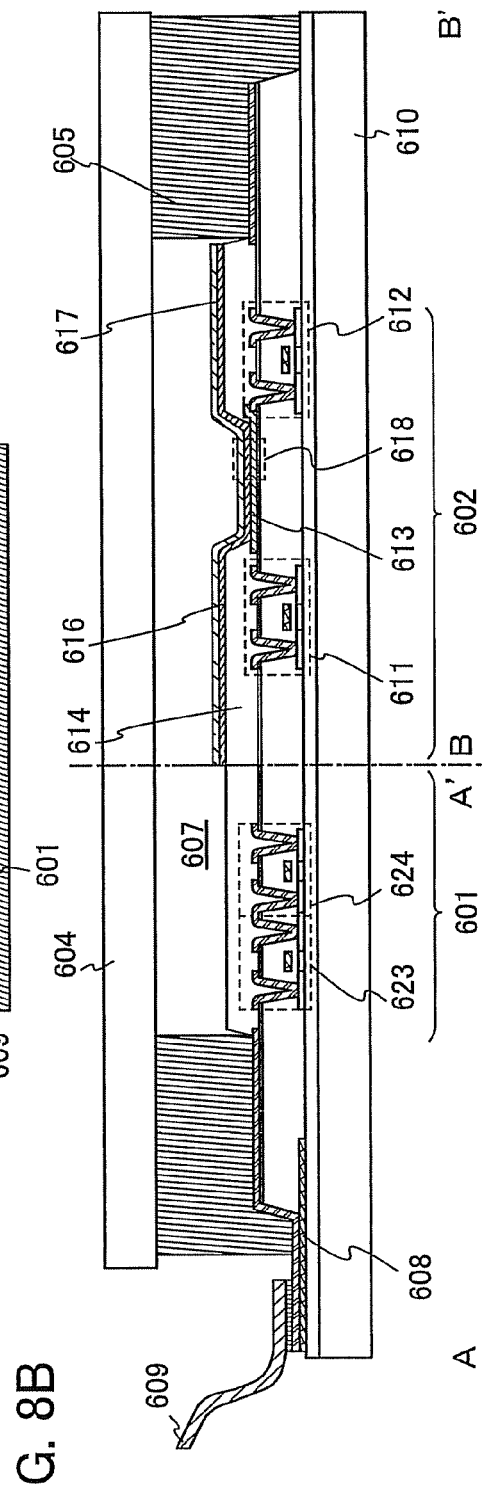

In Embodiment 3, a light-emitting device that has a light-emitting element according to an embodiment of the present invention in a pixel portion is described with a reference to FIGS. 8A and 8B. FIG. 8A is a top view of a light-emitting device and FIG. 8B is a cross sectional view taken along line A-A' and line B-B' of FIG. 8A. This light-emitting device includes a driver circuit portion (source side driver circuit) 601, a pixel portion 602, and a driver circuit portion (gate side driver circuit) 603 shown by dotted lines, for controlling the light emission of the light-emitting element. In addition, reference numeral 604 denotes a sealing substrate; 605, a sealing material; and 607, a space surrounded by the sealing material 605.

Note that a leading wiring 608 transmits a signal inputted to the source side driver circuit 601 and the gate side driver circuit 603, and receives a video signal, a clock signal, a start signal, a reset signal or the like from a flexible printed circuit (FPC) 609 to serve as an external input terminal. Although only the FPC is illustrated here, this FPC may be provided with a printed wiring board (PWB). The light-emitting device according to the present specification includes not only the light-emitting device itself but also the light emitting device to which the FPC or PWB is attached.

A sectional structure of the light-emitting device is described next with reference to FIG. 8B. The driver circuit portion and the pixel portion are formed on an element substrate 610, and the source side driver circuit 601 as the driver circuit portion and a pixel in the pixel portion 602 are illustrated here.

Note that as the source side driver circuit 601, a CMOS circuit in which an n-channel ITT 623 and a p-channel TFT 624 are combined is formed. The driver circuit may be formed by various circuits such as a CMOS circuit, a PMOS circuit, or an NMOS circuit. Although the driver circuit is formed over the substrate provided with the pixel portion as a driverintegration type device in this embodiment, the driver circuit may also be formed outside the substrate provided with the pixel portion, instead of on the substrate.

The pixel portion 602 is formed with a plurality of pixels including a switching TFT 611, a current-controlling TFT 612, and a first electrode 613 that is electrically connected to the drain of the current-controlling TFT 612. Note that an insulator 614 is formed covering the end portions of the first electrode 613. Here, the insulator 614 is formed using a positive photosensitive acrylic resin film.

In order to prevent adverse influence on a light-emitting element 618, the insulator 614 is formed to have a curved surface with curvature at its upper or lower end portion. For example, in a case where a positive photosensitive acrylic is used as a material of the insulator 614, it is preferable that the upper end portion of the insulator 614 have a curved surface with a curvature radius (0.2 μm to 3 μm). Note that the insulator 614 can be formed using either a negative photosensitive material that becomes insoluble in an etchant when irradiated with light or a positive photosensitive material that becomes dissoluble in an etchant when irradiated with light.

An EL layer 616 and a second electrode 617 are formed over the first electrode 613. Here, the first electrode 613 can be faulted with various metals, alloys, electrically conductive compounds, or a mixture of these substances. In a case where the first electrode 613 is used as an anode, it is preferable to use, among those materials, metals, alloys, electrically conductive compounds, a mixture of these substances, or the like, having a high work function (a work function of 4.0 eV or higher). For example, the first electrode 613 can have a single-layer structure of an indium oxide-tin oxide film containing silicon, an indium oxide-zinc oxide film, a titanium nitride film, a chromium film, a tungsten film, a Zn film, a Pt film, or the like; a stacked structure of a titanium nitride film and a film containing aluminum as a main component; a three-layer structure of a titanium nitride film, a film containing aluminum as a main component, and a titanium nitride film; or the like.

The EL layer 616 is formed by various methods such as an evaporation method using an evaporation mask, an inkjet method, or a spin coating method. The EL layer 616 has the light-emitting layer described in Embodiment 1. Other materials to form the EL layer 616 may be a low molecular compound or a high molecular compound including oligomer and dendrimer. For the EL layer 616, not only an organic compound but also an inorganic compound may be used.

For the second electrode 617, various types of metals, alloys, electrically conductive compounds, a mixture of these substances, or the like can be used. In a case where the second electrode is used as a cathode, it is preferable to use, among those materials, metals, alloys, electrically conductive compounds, a mixture of these substances, or the like, having a low work function (a work function of 3.8 eV or lower). For example, the second electrode can be formed using an element belonging to Group 1 or Group 2 of the periodic table, i.e., an alkali metal such as lithium (Li) or cesium (Cs), an alkaline earth metal such as magnesium (Mg), calcium (Ca), or strontium (Sr), or an alloy containing any of these, such as MgAg or AlLi. In a case where light generated in the EL layer 616 is transmitted through the second electrode 617, the second electrode 617 is preferably formed using a multilayer of a metal thin film whose thickness is made small, and a transparent conductive film such as an indium oxide-tin oxide (ITO) film, an indium oxide-tin oxide film containing silicon or silicon oxide, an indium oxide-zinc oxide (IZO) film, or an indium oxide film containing tungsten oxide and zinc oxide (IWZO).

By bonding a sealing substrate 604 and the element substrate 610 with the sealing material 605, a light-emitting element 618 is provided in the space 607 surrounded by the element substrate 610, the sealing substrate 604, and the sealing material 605. Note that the space 607 is filled with filler. The space 607 can be filled with an inert gas such as nitrogen or argon, or the sealing material 605.

An epoxy resin is preferably used as the sealing material 605. In addition, it is desirable to use a material that allows the permeation of moisture or oxygen as little as possible. In addition to a glass substrate or a quartz substrate, a plastic substrate formed with fiberglass-reinforced plastics (FRP), polyvinyl fluoride) (PVF), polyester, acrylic, or the like can be used as the sealing substrate 604.

As described above, the light-emitting device including the light-emitting element of an embodiment of the present invention can be obtained.

A light-emitting device of an embodiment of the present invention includes the light-emitting element described in Embodiment 1 or Embodiment 2. Therefore, a highly efficient light-emitting device can be obtained. In addition, the power consumption of the light-emitting device can be reduced.

Figure 9A:
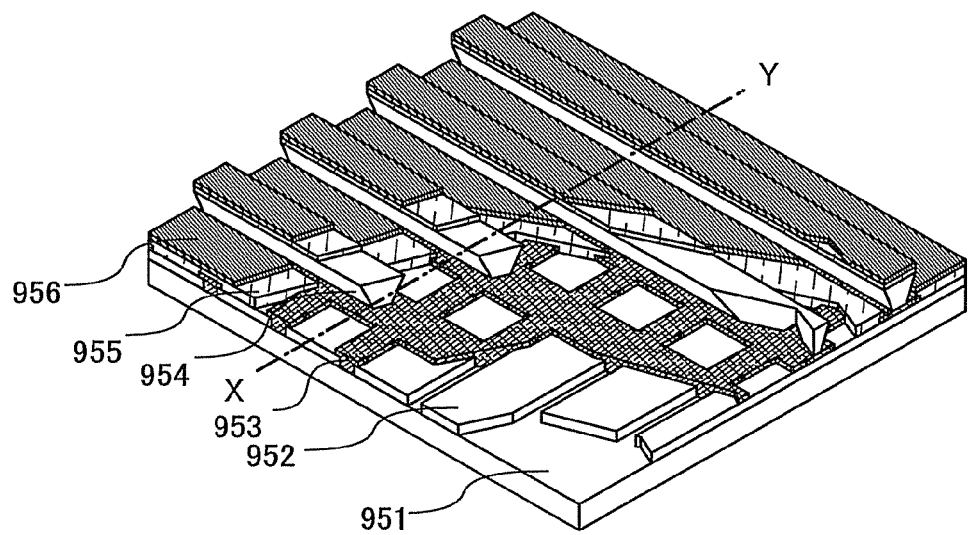
FIGS. 9A and 9B illustrate a light-emitting device according to one embodiment of the present invention.
Figure 9B:
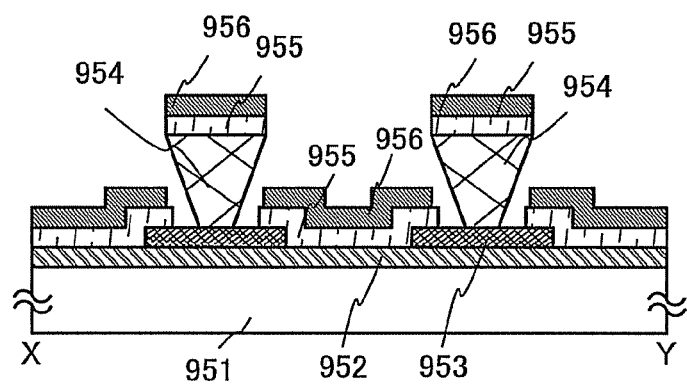

This embodiment describes the active-matrix light-emitting device in which the driving of the light-emitting element is controlled by a thin-film transistor. However, a passive-matrix light-emitting device may also be adopted. FIGS. 9A and 9B illustrate a passive-matrix light-emitting device which is manufactured by the application of an embodiment of the present invention. FIG. 9A is a perspective view of the light-emitting device, and FIG. 9B is a cross-sectional view of FIG. 9A taken along line X-Y. In FIGS. 9A and 9B, over a substrate 951, an EL layer 955 is provided between electrodes 952 and electrodes 956. The end portions of the electrodes 952 are covered with an insulating layer 953. A partition layer 954 is provided over the insulating layer 953. The sidewalls of the partition layer 954 slope so that the distance between both of the sidewalls is gradually narrowed toward the surface of the substrate. That is, a cross section in the short side of the partition layer 954 is trapezoidal, and a lower side (the side in the same direction as the plane direction of the insulating layer 953, and in contact with the insulating layer 953) is shorter than an upper side (the side in the same direction as the plane direction of the insulating layer 953, and not in contact with the insulating layer 953). Providing the partition layer 954 in this manner allows the patterning of a cathode. In addition, in a passive-matrix light-emitting device, a light-emitting device with low power consumption can be obtained by including a light-emitting element with high luminous efficiency according to an embodiment of the present invention.

Note that this embodiment can be combined with another embodiment, as appropriate.

Embodiment 4

In Embodiment 4, electronic devices of an embodiment of the present invention including the light-emitting device described in Embodiment 3 in a part are described. The electronic devices of an embodiment of the present invention each have the light-emitting element described in Embodiment 1 or Embodiment 2, and a display portion having high luminous efficiency. Moreover, they have the display portion with low power consumption.

Electronic devices manufactured using the light-emitting device of an embodiment of the present invention include a video camera; a digital camera; a goggle type display; a navigation system; an audio reproducing device such as a car audio set or an audio component set; a computer; a game machine; a portable information terminal such as a mobile computer, a mobile phone, a portable game machine, or an e-book reader; an image reproducing device provided with a recording medium (specifically, a device provided with a display device that can reproduce a recording medium such as a digital versatile disc (DVD) and display the image), or the like. Specific examples of these electronic devices are illustrated in FIGS. 10A to 10D.

Figure 10A:
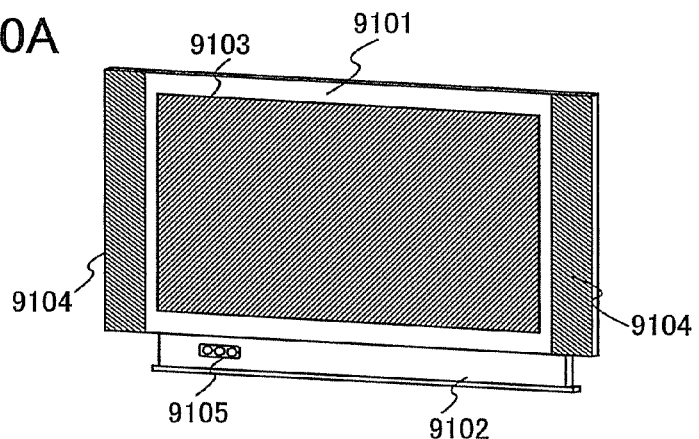
FIGS. 10A to 10D illustrate electronic devices according to one embodiment of the present invention.

FIG. 10A illustrates a television device of this embodiment, including a chassis 9101, a support base 9102, a display portion 9103, a speaker portion 9104, a video input terminal 9105, and the like. In the display portion 9103 of this television device, light-emitting elements described in Embodiment 1 or Embodiment 2 are arranged in a matrix form. Features of the light-emitting element include high luminous efficiency and low power consumption. Since the display portion 9103 comprising the light-emitting elements has a similar feature, this television device has reduced power consumption. With such a feature, the number or scale of power supply circuits in the television device can be drastically reduced, and therefore, the size and weight of the chassis 9101 and the support base 9102 can be reduced. In the television device of this embodiment, low power consumption and reduction in size and weight are achieved; accordingly, a product which is suitable for living environment can be provided.

Figure 10B:
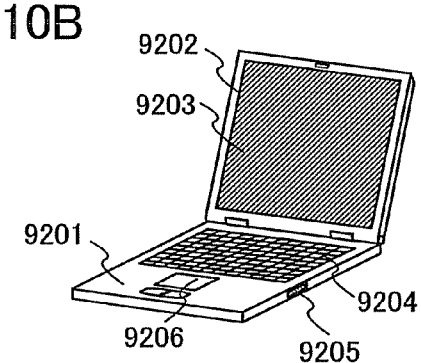

FIG. 10B illustrates a computer of this embodiment, including a main body 9201, a chassis 9202, a display portion 9203, a keyboard 9204, an external connection port 9205, a pointing device 9206, and the like. In the display portion 9203 of this computer, light-emitting elements described in Embodiment 1 or Embodiment 2 are arranged in a matrix form. Features of the light-emitting element include high luminous efficiency and low power consumption. Since the display portion 9203 comprising the light-emitting elements has a similar feature, this computer has reduced power consumption. With such a feature, the number or scale of power supply circuits in the computer can be drastically reduced, and therefore, the size and weight of the main body 9201 and the chassis 9202 can be reduced. In the computer of this embodiment, low power consumption and reduction in size and weight are achieved; accordingly, a product which is suitable for environment can be provided.

Figure 10C:
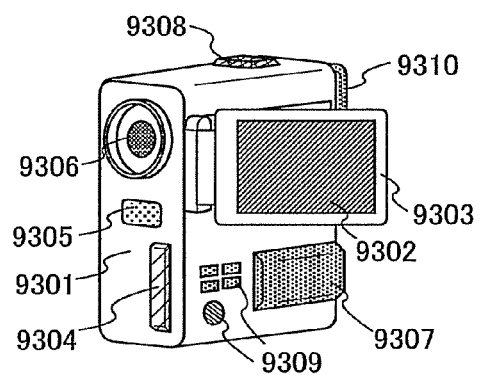

FIG. 10C illustrates a camera of this embodiment, including a main body 9301, a display portion 9302, a chassis 9303, an external connection port 9304, a remote control receiving portion 9305, an image receiving portion 9306, a battery 9307, an audio input portion 9308, operation keys 9309, an eyepiece portion 9310, and the like. In the display portion 9302 of this camera, light-emitting elements described in Embodiment 1 or, Embodiment 2 are arranged in a matrix form. Features of the light-emitting element include high luminous efficiency and low power consumption. Since the display portion 9302 comprising the light-emitting elements has a similar feature, this camera has reduced power consumption. With such a feature, the number or scale of power supply circuits in the camera can be drastically reduced, and therefore, the size and weight of the main body 9301 can be reduced. In the camera of this embodiment, low power consumption and reduction in size and weight are achieved; accordingly, a product which is suitable for being carried around can be provided.

Figure 10D:
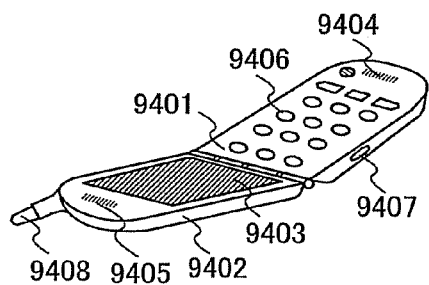

FIG. 10D illustrates a mobile phone of this embodiment, including a main body 9401, a chassis 9402, a display portion 9403, an audio input portion 9404, an audio output portion 9405, operation keys 9406, an external connection port 9407, an antenna 9408, and the like. In the display portion 9403 of this mobile phone, light-emitting elements described in Embodiment 1 or Embodiment 2 are arranged in a matrix form. Features of the light-emitting element include high emission efficiency and low power consumption. Since the display portion 9403 comprising the light-emitting elements has a similar feature, this mobile phone has reduced power consumption. With such a feature, the number or scale of power supply circuits in the mobile phone can be drastically reduced, and accordingly, the size and weight of the main body 9401 and the chassis 9402 can be reduced. In the mobile phone of this embodiment, low power consumption and reduction in size and weight are achieved; accordingly, a product which is suitable for being carried around can be provided.

Figure 16A:
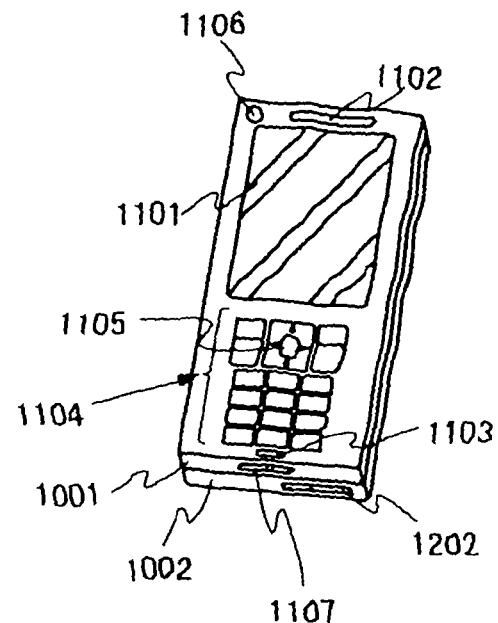
FIGS. 16A to 16C illustrate an electronic device according to one embodiment of the present invention.
Figure 16B:
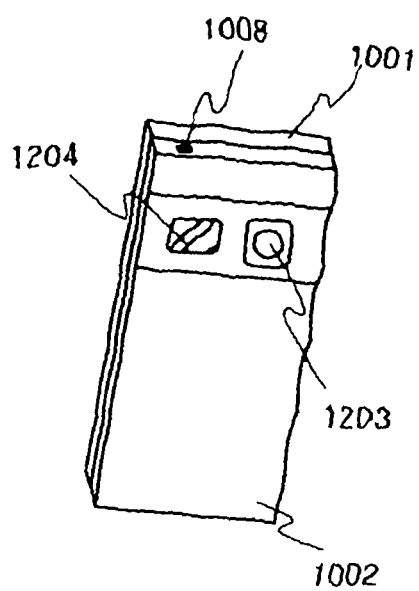
Figure 16C:
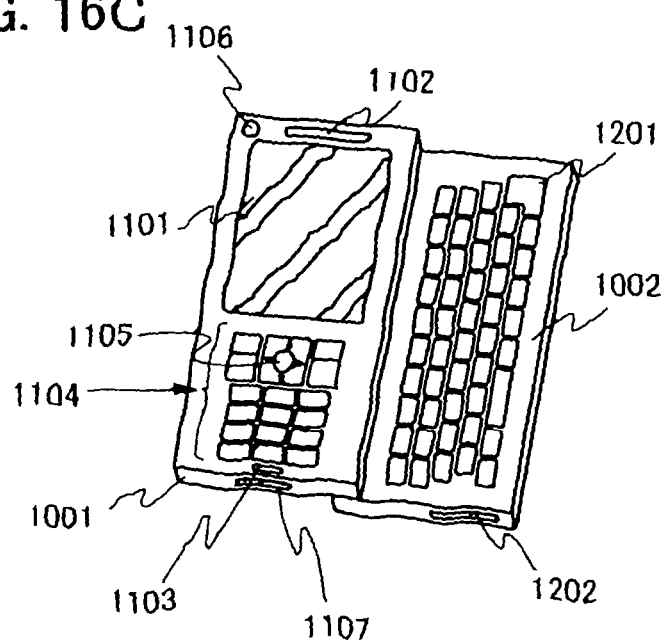

FIG. 16A to 16C illustrate another example of a mobile phone that has a structure different from that of the mobile phone in FIG. 10D. FIG. 16A is a front view; FIG. 16B, a rear view; and FIG. 16C, a development view. The mobile phone in FIGS. 16A to 16C is a so-called smartphone that has both of the functions as a phone and as a portable information terminal, and includes a computer to conduct a variety of data processing in addition to voice communication.

The mobile phone illustrated in FIGS. 16A and 16B has two chassis: a chassis 1001 and a chassis 1002. The chassis 1001 includes a display portion 1101, a speaker 1102, a microphone 1103, operation keys 1104, a pointing device 1105, a camera lens 1106, an external connection terminal 1107, and the like, while the chassis 1002 includes a keyboard 1201, an external memory slot 1202, a camera lens 1203, a light 1204, an earphone terminal 1008, and the like. In addition, an antenna is included in the chassis 1001.

Further, in addition to the above structure, the mobile phone may include a non-contact IC chip, a small size memory device, or the like.

In the display portion 1101, the light-emitting device described in Embodiment 3 can be included, and a display direction can be changed as appropriate depending on a usage mode. Since the mobile phone is provided with the camera lens 1106 on the same surface as the display portion 1101, it can be used as a videophone. Further, a still image and a moving image can be taken with the camera lens 1203, the light 1204, and the display portion 1101 as a viewfinder. The speaker 1102 and the microphone 1103 are to be used not only for voice communication, but also for a videophone, recording, reproduction, and the like. With the operation keys 1104, the operation of incoming and outgoing calls, input of simple information such as e-mails or the like, scrolling of a screen, moving a cursor, and the like are possible. Further, the chassis 1001 and the chassis 1002 in FIG. 16A, which are overlapped with each other, are slid as illustrated in FIG. 16C, and can be used as a portable information terminal. In this case, smooth operation is possible with the keyboard 1201 and the pointing device 1105. The external connection terminal 1107 can be connected to an AC adapter or a variety of cables such as a USB cable to charge a battery in the mobile phone and to perform data communication with a computer or the like. Moreover, a large amount of data can be stored and/or moved by inserting a storage medium into the external memory slot 1202.

Further, in addition to the above-described functions, the mobile phone may also have an infrared communication function, a television reception function, or the like.

Figure 11:
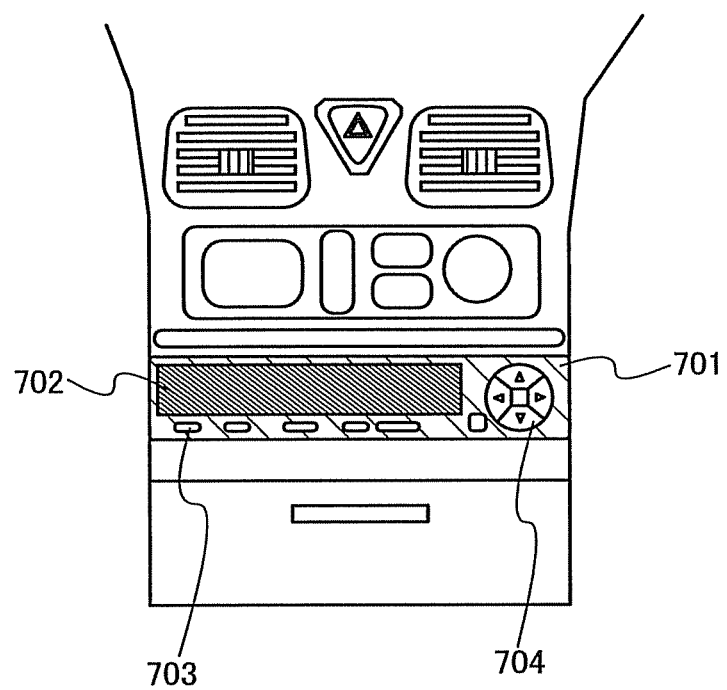
FIG. 11 illustrates an electronic device according to one embodiment of the present invention.

FIG. 11 illustrates an audio reproducing device, specifically, a car audio system including a main body 701, a display portion 702, and operation switches 703 and 704. The display portion 702 can be formed using the passive-matrix or active-matrix light-emitting device described in Embodiment 3.

Alternatively, the display portion 702 may employ a segment type light-emitting device. In any case, the use of the light-emitting element of an embodiment of the present invention makes it possible to form a bright display portion having reduced power consumption, which allows the car audio system to be operated with the use of a vehicle power source (12 V to 42 V). Although an in-car audio system is described in this embodiment, an embodiment of the present invention may also be used for a portable audio device or an audio device for household use.

Figure 12:
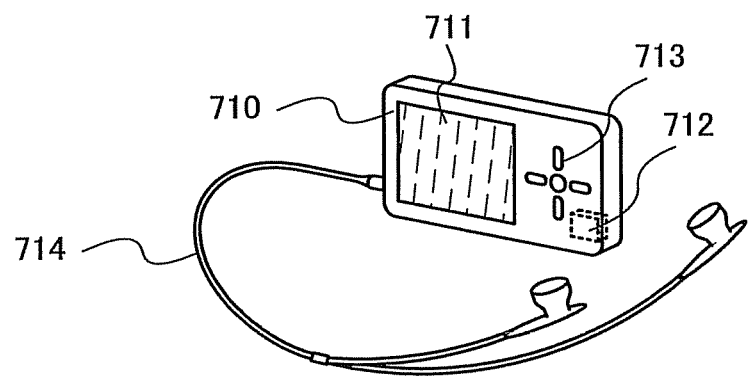
FIG. 12 illustrates an electronic device according to one embodiment of the present invention.

FIG. 12 illustrates a digital player as an example of a sound reproduction device. The digital player illustrated in FIG. 12 includes a main body 710, a display portion 711, a memory portion 712, an operation portion 713, earphones 714, or the like. Note that a pair of headphones or a wireless pair of earphones can be used instead of the pair of earphones 714. The display portion 711 can be fowled using the passive-matrix or active-matrix light-emitting device described in Embodiment 3. Alternatively, the display portion 711 may employ a segment type light-emitting device. In any case, the use of the light-emitting element of an embodiment of the present invention makes it possible to form a bright display portion with reduced power consumption, which allows the digital player to display images even if a secondary battery such as a nickel-metal hydride battery is used. A hard disk or a nonvolatile memory is used as the memory portion 712. For example, a NAND type nonvolatile memory with a recording capacity of 20 to 200 gigabytes (GB) is used, and by operating the operation portion 713, an image or a sound (e.g., music) can be recorded and reproduced. Note that the power consumption of the display portion 702 in FIG. 11 and the display portion 711 in FIG. 12 can be reduced by displaying white characters on the black background. This method is particularly effective for portable audio systems.

As described above, the range of light-emitting devices manufactured as applications of an embodiment of the present invention is extremely wide, and the light-emitting device can be applied to electronic devices in various fields. By the application of an embodiment of the present invention, an electronic device which has a display portion with high luminous efficiency and low power consumption can be manufactured.

The light-emitting device of an embodiment of the present invention can also be used as a lighting device. An example using the light-emitting element of an embodiment of the present invention as a lightning device is described with reference to FIG. 13.

Figure 13:
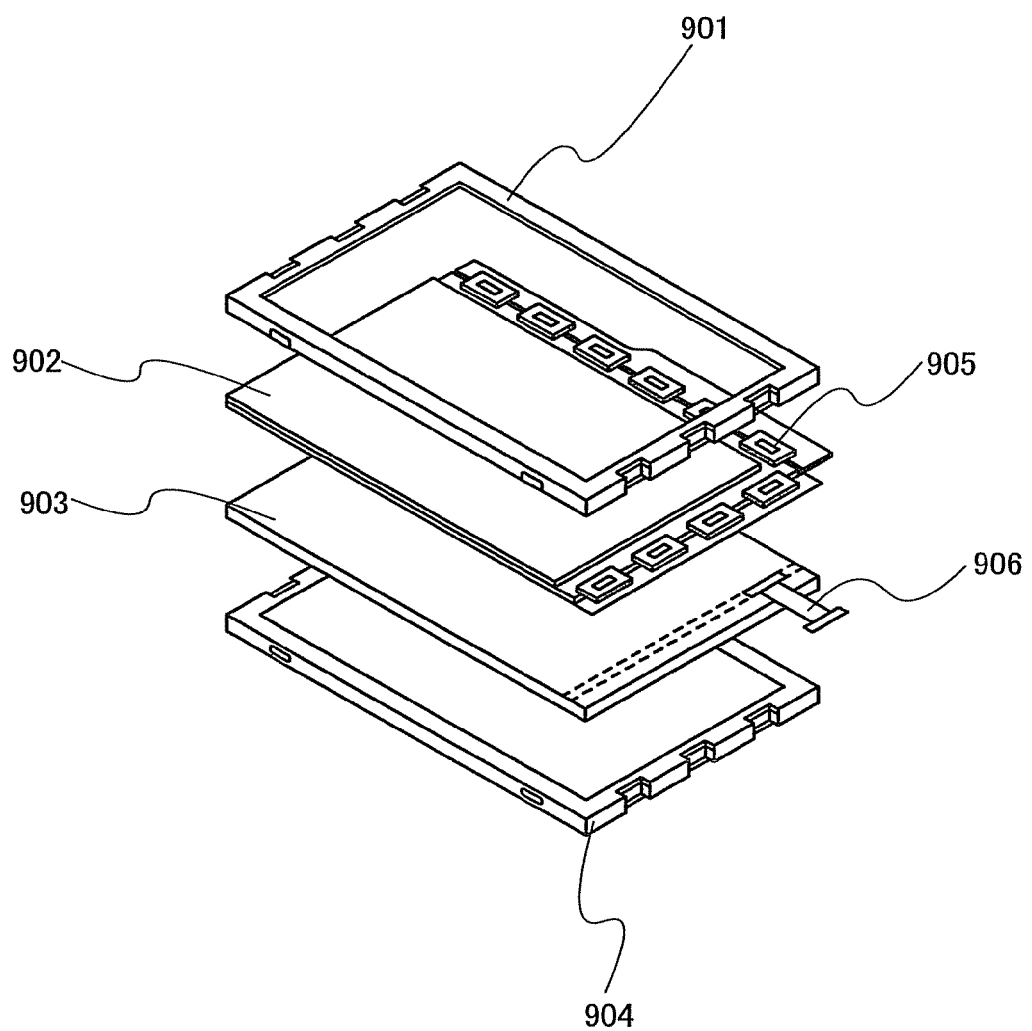
FIG. 13 illustrates an electronic device according to one embodiment of the present invention.

FIG. 13 illustrates a liquid crystal display device using the light-emitting device to which an embodiment of the present invention is applied as a backlight, as an example of the electronic device using a light-emitting device according to an embodiment of the present invention as a lighting device. The liquid crystal display device illustrated in FIG. 13 includes a chassis 901, a liquid crystal layer 902, a backlight 903, and a chassis 904, and the liquid crystal layer 902 is connected to a driver IC 905. The light-emitting device to which an embodiment of the present invention is applied is used as the backlight 903, and current is supplied through a terminal 906.

Since the light-emitting device according to an embodiment of the present invention is thin and has high luminous efficiency and low consumption power, reduction in thickness and power consumption of a display device is possible by using a light-emitting device according to an embodiment of the present invention as a backlight of the liquid crystal display device. Moreover, a light-emitting device of an embodiment of the present invention is a plane emission type lighting device and can have a large area. Thus, the backlight can have a large area, and a liquid crystal display device having a large area can also be obtained.

Figure 14:
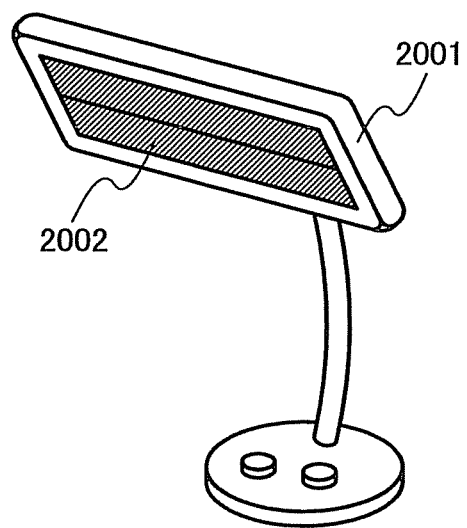
FIG. 14 illustrates a lighting device according to one embodiment of the present invention.

FIG. 14 illustrates an example in which a light-emitting device of an embodiment of the present invention is used as a desk lamp, which is one of lighting devices. The desk lamp illustrated in FIG. 14 includes a chassis 2001 and a light source 2002, and a light-emitting device according to an embodiment of the present invention is used as the light source 2002. Since the light-emitting device of an embodiment of the present invention has low power consumption and high emission efficiency, the power consumption of the desk lamp is also low.

Figure 15:
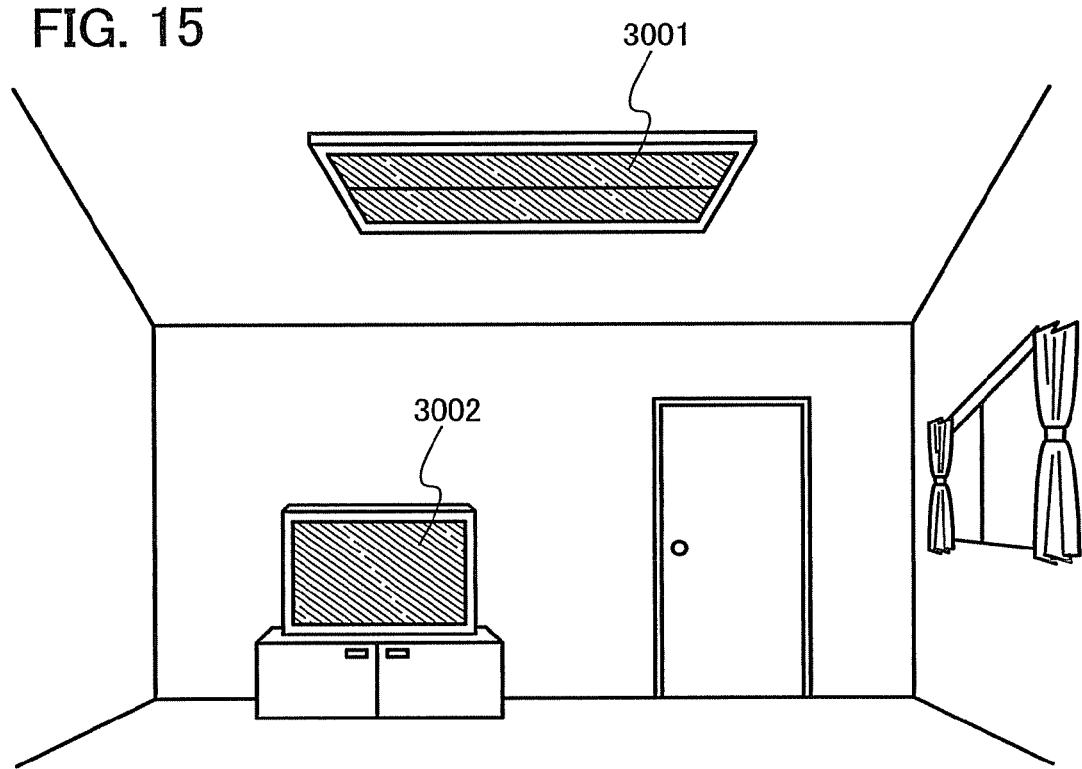
FIG. 15 illustrates a lighting device according to one embodiment of the present invention.

FIG. 15 illustrates an example in which a light-emitting device of an embodiment of the present invention is used as an indoor lighting device 3001. Since a light-emitting device according to an embodiment of the present invention can have a large area, the light-emitting device according to an embodiment of the present invention can be used as a lighting device having a large area. Since the light-emitting device according to an embodiment of the present invention has low power consumption and high emission efficiency, the power consumption of a lighting device according to an embodiment of the present invention can also be low. A light-emitting device of an embodiment of the present invention as described above can be used as the indoor lighting device 3001 in a room where public broadcasting or movies can be enjoyed with the television device 3002 according to an embodiment of the present invention as illustrated in FIG. 10A. In such a case, since low power consumption is realized in both of the devices, environmental load can be reduced.

Note that this embodiment can be combined with another embodiment, as appropriate.

This application is based on Japanese Patent Application serial No. 2008-223210 filed with Japan Patent Office on Sep. 1, in 2008, the entire contents of which are hereby incorporated by reference.

What is claimed is:

1. A light-emitting device comprising:
 a light-emitting layer sandwiched between and spaced from a pair of electrodes, the light-emitting layer comprising sequentially stacked first layer, second layer, and third layer,
 wherein the first layer comprises a first host material and a first luminescent material,
 wherein the second layer comprises a second host material and a second luminescent material,
 wherein the third layer comprises a third host material and a third luminescent material, and
 wherein triplet-excitation energy of the first host material and triplet-excitation energy of the third host material are greater than triplet-excitation energy of the second host material.

2. The light-emitting device according to claim 1, wherein the second luminescent material is a phosphorescent compound.

3. The light-emitting device according to claim 1, wherein the first luminescent material and the second luminescent material each are a fluorescent compound.

4. The light-emitting device according to claim 3, wherein the first luminescent material and the third luminescent material are the same as each other.

5. The light-emitting device according to claim 4, wherein emission color of the first luminescent material is complementary to emission color of the second luminescent material.

6. The light-emitting device according to claim 1, wherein a hole-transporting property of the first host material is higher than an electron-transporting property thereof.

7. The light-emitting device according to claim 1, wherein an electron-transporting property of the third host material is higher than a hole-transporting property thereof.

8. The light-emitting device according to claim 1, wherein the first host material is an aromatic amine compound.

9. The light-emitting device according to claim 1, wherein the third host material is a metal complex.

10. The light-emitting device according to claim 1, wherein the second host material has a π-electron-excessive heteroaromatic ring and a π-electron-deficient heteroaromatic ring.

11. The light-emitting device according to claim 1, further comprising a fourth layer between the first layer and the second layer,
    wherein the fourth layer comprises a bipolar organic compound, and
    wherein a thickness of the fourth layer ranges from 1 nm to 30 nm.

12. The light-emitting device according to claim 1, wherein a thickness of the second layer ranges from 5 nm to 20 nm.

13. The light-emitting device according to claim 1, wherein an emission color of the first luminescent material and an emission color of the second luminescent material exist in a complementary relationship.

14. The light-emitting device according to claim 1, further comprising:
    a hole-transporting layer between one of the pair of electrodes and the light-emitting layer; and
    an electron-transporting layer between the other of the pair of electrodes and the light-emitting layer.

15. A module comprising the light-emitting device according to claim 1 provided with a connector, wherein the connector is selected from a flexible printed circuit, a tape-automated bonding tape, and a tape-carrier package.

16. A module comprising the light-emitting device according to claim 1 equipped with an integrated circuit.

17. A lighting device comprising the light-emitting device according to claim 1.

18. An electronic device comprising the light-emitting device according to claim 1.

19. The light-emitting device according to claim 1, further comprising a hole-transporting layer between one of the pair of electrodes and the light-emitting layer.

20. The light-emitting device according to claim 1, further comprising an electron-transporting layer between one of the pair of electrodes and the light-emitting layer.

* * * * *